(12) United States Patent
Leung

(10) Patent No.: US 6,872,984 B1
(45) Date of Patent: Mar. 29, 2005

(54) METHOD OF SEALING A HERMETIC LID TO A SEMICONDUCTOR DIE AT AN ANGLE

(75) Inventor: Omar S. Leung, Palo Alto, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 0 days.

(21) Appl. No.: 10/179,664

(22) Filed: Jun. 24, 2002

Related U.S. Application Data

(60) Continuation-in-part of application No. 09/605,198, filed on Jun. 27, 2000, now abandoned, and application No. 09/866,266, filed on May 24, 2001, now Pat. No. 6,764,875, which is a division of application No. 09/124,710, filed on Jul. 29, 1998, now Pat. No. 6,303,986.

(51) Int. Cl.[7] .................. H01L 27/15; H01L 31/12; H01L 33/00; H01L 31/0203; H01L 21/00; H01L 23/02; H01J 15/00; H01J 5/00; H05K 5/06

(52) U.S. Cl. .................. 257/81; 257/433; 438/27; 438/65; 174/50.5; 174/50.63; 174/52.5

(58) Field of Search .................. 257/81, 99, 433, 257/434; 174/50.5, 50.51, 50.52, 50.61, 50.63, 52.3–52.5; 438/25, 26, 64–67, 116, 118, 121, 125

(56) References Cited

U.S. PATENT DOCUMENTS

| | | |
|---|---|---|
| 1,525,550 A | 2/1925 | Jenkins |
| 1,548,262 A | 8/1925 | Freedman |
| RE16,767 E | 10/1927 | Jenkins |
| 1,814,701 A | 7/1931 | Ives |
| 2,415,226 A | 2/1947 | Sziklai .................. 178/5.4 |
| 2,783,406 A | 2/1957 | Vanderhooft .................. 313/70 |
| 2,920,529 A | 1/1960 | Blythe .................. 88/73 |
| 2,991,690 A | 7/1961 | Grey et al. .................. 88/16.6 |
| RE25,169 E | 5/1962 | Glenn |
| 3,256,465 A | 6/1966 | Weissenstern et al. ...... 317/101 |
| 3,388,301 A | 6/1968 | James .................. 317/234 |

(Continued)

FOREIGN PATENT DOCUMENTS

| | | | |
|---|---|---|---|
| DE | 32 33 195 A1 | 3/1983 | .......... H01L/23/52 |
| DE | 43 23 799 A1 | 1/1994 | .......... H01L/23/50 |
| DE | 197 23 618 A1 | 12/1997 | .......... G03F/1/14 |
| DE | 197 51 716 A1 | 5/1998 | .......... G02B/27/14 |
| DE | 198 46 532 C1 | 5/2000 | .......... G02B/27/09 |
| EP | 0 089 044 A2 | 9/1983 | .......... H01L/23/10 |
| EP | 0 261 901 A2 | 3/1988 | .......... G09G/3/36 |
| EP | 0 314 437 A1 | 10/1988 | .......... H01L/25/08 |
| EP | 0 304 263 A2 | 2/1989 | .......... H01L/25/065 |
| EP | 0 306 308 A2 | 3/1989 | .......... H04N/3/14 |

(Continued)

OTHER PUBLICATIONS

R. Apte, "Grating Light Valves for High Resolution Displays", Solid State Sensors and Actuators Workshop, Ph D. Dissertation, Stanford University (Jun. 1994).

(Continued)

*Primary Examiner*—Erik Kielin
(74) *Attorney, Agent, or Firm*—Okamoto & Benedicto LLP

(57) ABSTRACT

The current invention provides a optical MEM device and system with an angled lid for hermetically sealing an active MEMS structure. The lid is sealed through an asymmetric seal formed with sealing rings having an asymmetric distribution of solder wetting surfaces which tilts the lid, when the lid and a substrate are soldered together. The asymmetric distribution wetting surfaces can be provided by forming one or more edge features, by patterning portions of the sealing rings or both. Preferably, the lid is transparent to one or more wavelengths of light in a range of 300 to 3000 Angstroms and hermetically seals a grating light valve structure having a plurality of movable ribbon for modulating light through the lid.

8 Claims, 12 Drawing Sheets

U.S. PATENT DOCUMENTS

| | | |
|---|---|---|
| 3,443,871 A | 5/1969 | Chitayat ............... 356/106 |
| 3,553,364 A | 1/1971 | Lee ..................... 178/7.3 |
| 3,576,394 A | 4/1971 | Lee ..................... 178/7.3 |
| 3,600,798 A | 8/1971 | Lee ........................ 29/592 |
| 3,656,837 A | 4/1972 | Sandbank ............ 350/161 |
| 3,657,610 A | 4/1972 | Yamamoto et al. ...... 317/243 |
| 3,693,239 A | 9/1972 | Dix ....................... 29/470 |
| 3,743,507 A | 7/1973 | Ih et al. ................... 96/81 |
| 3,752,563 A | 8/1973 | Torok et al. ........... 350/151 |
| 3,781,465 A | 12/1973 | Ernstoff et al. ....... 178/5.4 BD |
| 3,783,184 A | 1/1974 | Ernstoff et al. ....... 178/5.4 BD |
| 3,792,916 A | 2/1974 | Sarna ................... 350/163 |
| 3,802,769 A | 4/1974 | Rotz et al. ............... 352/43 |
| 3,811,186 A | 5/1974 | Larnerd et al. ........... 29/626 |
| 3,861,784 A | 1/1975 | Torok ................. 350/162 R |
| 3,862,360 A | 1/1975 | Dill et al. ............. 178/7.3 D |
| 3,871,014 A | 3/1975 | King et al. ............... 357/67 |
| 3,886,310 A | 5/1975 | Guldberg et al. ...... 178/7.5 D |
| 3,896,338 A | 7/1975 | Nathanson et al. ..... 315/373 |
| 3,915,548 A | 10/1975 | Opittek .................. 350/3.5 |
| 3,935,499 A | 1/1976 | Oess .................... 313/413 |
| 3,935,500 A | 1/1976 | Oess et al. .............. 313/495 |
| 3,938,881 A | 2/1976 | Biegelsen et al. ........ 350/161 |
| 3,941,456 A | 3/1976 | Schilz et al. ............ 350/161 |
| 3,942,245 A | 3/1976 | Jackson et al. ........... 29/591 |
| 3,943,281 A | 3/1976 | Keller et al. .......... 178/7.5 D |
| 3,947,105 A | 3/1976 | Smith ................... 353/121 |
| 3,969,611 A | 7/1976 | Fonteneau .............. 219/502 |
| 3,980,476 A | 9/1976 | Wysocki ................... 96/1.1 |
| 3,991,416 A | 11/1976 | Byles et al. ............ 340/324 R |
| 4,001,663 A | 1/1977 | Bray ....................... 321/2 |
| 4,004,849 A | 1/1977 | Shattuck ............... 350/160 R |
| 4,006,968 A | 2/1977 | Ernstoff et al. ....... 350/160 LC |
| 4,009,939 A | 3/1977 | Okano ................. 350/162 SF |
| 4,011,009 A | 3/1977 | Lama et al. ........... 350/162 R |
| 4,012,116 A | 3/1977 | Yevick .................. 350/132 |
| 4,012,835 A | 3/1977 | Wallick ................... 29/591 |
| 4,017,158 A | 4/1977 | Booth ................. 350/162 SF |
| 4,020,381 A | 4/1977 | Oess et al. .............. 313/302 |
| 4,021,766 A | 5/1977 | Aine ....................... 338/2 |
| 4,034,211 A | 7/1977 | Horst et al. .......... 235/61.12 N |
| 4,034,399 A | 7/1977 | Drukier et al. ............ 357/68 |
| 4,035,068 A | 7/1977 | Rawson ................. 353/122 |
| 4,067,129 A | 1/1978 | Abramson et al. ......... 40/563 |
| 4,084,437 A | 4/1978 | Finnegan ................. 73/361 |
| 4,090,219 A | 5/1978 | Ernstoff et al. ........... 358/59 |
| 4,093,346 A | 6/1978 | Nishino et al. ........ 350/162 SF |
| 4,093,921 A | 6/1978 | Buss .................... 325/459 |
| 4,093,922 A | 6/1978 | Buss .................... 325/459 |
| 4,100,579 A | 7/1978 | Ernstoff ................. 358/230 |
| 4,103,273 A | 7/1978 | Keller .................... 338/2 |
| 4,126,380 A | 11/1978 | Borm ................... 350/266 |
| 4,127,322 A | 11/1978 | Jacobson et al. ........... 353/31 |
| 4,135,502 A | 1/1979 | Peck .................... 128/76.5 |
| 4,139,257 A | 2/1979 | Matsumoto .............. 350/6.1 |
| 4,143,943 A | 3/1979 | Rawson ................. 350/120 |
| 4,163,570 A | 8/1979 | Greenaway ............. 283/8 A |
| 4,184,700 A | 1/1980 | Greenaway ................ 283/6 |
| 4,185,891 A | 1/1980 | Kaestner ................ 350/167 |
| 4,190,855 A | 2/1980 | Inoue ..................... 357/80 |
| 4,195,915 A | 4/1980 | Lichty et al. ............. 350/345 |
| 4,205,428 A | 6/1980 | Ernstoff et al. ........... 29/592 R |
| 4,211,918 A | 7/1980 | Nyfeler et al. ............ 235/454 |
| 4,223,050 A | 9/1980 | Nyfeler et al. ............ 427/163 |
| 4,225,913 A | 9/1980 | Bray ..................... 363/97 |
| 4,249,796 A | 2/1981 | Sincerbox et al. ......... 350/370 |
| 4,250,217 A | 2/1981 | Greenaway .............. 428/161 |
| 4,250,393 A | 2/1981 | Greenaway .............. 250/566 |
| 4,256,787 A | 3/1981 | Shaver et al. ............... 428/1 |
| 4,257,016 A | 3/1981 | Kramer, Jr. et al. ........ 322/7.51 |
| 4,290,672 A | 9/1981 | Whitefield ............... 350/358 |
| 4,295,145 A | 10/1981 | Latta .................... 346/108 |
| 4,311,999 A | 1/1982 | Upton et al. ............. 340/755 |
| 4,327,411 A | 4/1982 | Turner ................... 364/900 |
| 4,327,966 A | 5/1982 | Bloom ................. 350/162 R |
| 4,331,972 A | 5/1982 | Rajchman ................ 358/60 |
| 4,336,982 A | 6/1982 | Rector, Jr. ............... 350/358 |
| 4,338,660 A | 7/1982 | Kelley et al. ............. 364/200 |
| 4,343,535 A | 8/1982 | Bleha, Jr. ............... 350/342 |
| 4,346,965 A | 8/1982 | Sprague et al. ........... 350/358 |
| 4,348,079 A | 9/1982 | Johnson ................. 350/358 |
| 4,355,463 A | 10/1982 | Burns ..................... 29/827 |
| 4,361,384 A | 11/1982 | Bosserman ............... 350/174 |
| 4,369,524 A | 1/1983 | Rawson et al. ........... 455/606 |
| 4,374,397 A | 2/1983 | Mir ....................... 358/75 |
| 4,389,096 A | 6/1983 | Hori et al. ............. 350/339 R |
| 4,391,490 A | 7/1983 | Hartke .................. 350/356 |
| 4,396,246 A | 8/1983 | Holman ................ 350/96.14 |
| 4,398,798 A | 8/1983 | Krawczak et al. ..... 350/162.24 |
| 4,400,740 A | 8/1983 | Traino et al. ............. 358/293 |
| 4,408,884 A | 10/1983 | Kleinknecht et al. ....... 356/355 |
| 4,414,583 A | 11/1983 | Hooker, III ............. 358/300 |
| 4,417,386 A | 11/1983 | Exner ..................... 29/590 |
| 4,418,397 A | 11/1983 | Brantingham et al. ...... 364/900 |
| 4,420,717 A | 12/1983 | Wallace et al. ........... 318/696 |
| 4,422,099 A | 12/1983 | Wolfe ................... 358/293 |
| 4,426,768 A | 1/1984 | Black et al. ............... 29/583 |
| 4,430,584 A | 2/1984 | Someshwar et al. ........ 307/465 |
| 4,435,041 A | 3/1984 | Torok et al. .......... 350/162.24 |
| 4,440,839 A | 4/1984 | Mottier .................... 430/2 |
| 4,443,819 A | 4/1984 | Funada et al. ............ 358/236 |
| 4,443,845 A | 4/1984 | Hamilton et al. .......... 364/200 |
| 4,447,881 A | 5/1984 | Brantingham et al. ...... 364/488 |
| 4,454,591 A | 6/1984 | Lou .................... 364/900 |
| 4,456,338 A | 6/1984 | Gelbart ................. 350/358 |
| 4,460,907 A | 7/1984 | Nelson ................. 346/153.1 |
| 4,462,046 A | 7/1984 | Spight .................. 358/101 |
| 4,467,342 A | 8/1984 | Tower .................... 357/30 |
| 4,468,725 A | 8/1984 | Venturini ................ 363/160 |
| 4,483,596 A | 11/1984 | Marshall ................ 350/385 |
| 4,484,188 A | 11/1984 | Ott ...................... 340/728 |
| 4,487,677 A | 12/1984 | Murphy ................. 204/247 |
| 4,492,435 A | 1/1985 | Banton et al. ............ 350/360 |
| 4,503,494 A | 3/1985 | Hamilton et al. .......... 364/200 |
| 4,511,220 A | 4/1985 | Scully ................... 350/403 |
| 4,538,883 A | 9/1985 | Sprague et al. ........... 350/356 |
| 4,545,610 A | 10/1985 | Lakritz et al. ............. 29/589 |
| 4,556,378 A | 12/1985 | Nyfeler et al. ............ 425/143 |
| 4,558,171 A | 12/1985 | Gantley et al. .......... 174/52 FP |
| 4,561,011 A | 12/1985 | Kohara et al. |
| 4,561,044 A | 12/1985 | Ogura et al. .............. 362/84 |
| 4,566,935 A | 1/1986 | Hornbeck ............... 156/626 |
| 4,567,585 A | 1/1986 | Gelbart ................... 369/97 |
| 4,571,041 A | 2/1986 | Gaudyn ................... 353/10 |
| 4,571,603 A | 2/1986 | Hornbeck et al. ......... 346/160 |
| 4,577,932 A | 3/1986 | Gelbart ................. 350/358 |
| 4,577,933 A | 3/1986 | Yip et al. ............... 350/358 |
| 4,588,957 A | 5/1986 | Balant et al. .............. 330/4.3 |
| 4,590,548 A | 5/1986 | Maytum ................ 363/161 |
| 4,594,501 A | 6/1986 | Culley et al. ............ 219/492 |
| 4,596,992 A | 6/1986 | Hornbeck .............. 346/76 PH |
| 4,615,595 A | 10/1986 | Hornbeck ............... 353/122 |
| 4,623,219 A | 11/1986 | Trias .................... 350/351 |
| 4,636,039 A | 1/1987 | Turner .................. 350/356 |
| 4,636,866 A | 1/1987 | Hattori .................. 358/236 |
| 4,641,193 A | 2/1987 | Glenn .................. 358/233 |
| 4,645,881 A | 2/1987 | LeToumelin et al. ....... 379/252 |
| 4,646,158 A | 2/1987 | Ohno et al. ............. 358/236 |
| 4,649,085 A | 3/1987 | Landram ................ 428/620 |
| 4,649,432 A | 3/1987 | Watanabe ............... 358/241 |
| 4,652,932 A | 3/1987 | Miyajima et al. ......... 358/236 |

| | | | | | |
|---|---|---|---|---|---|
| 4,655,539 A | 4/1987 | Caulfield et al. ............ 350/3.6 | 4,978,202 A | 12/1990 | Yang ...................... 350/331 R |
| 4,660,938 A | 4/1987 | Kazan ........................ 350/355 | 4,982,184 A | 1/1991 | Kirkwood ................... 340/783 |
| 4,661,828 A | 4/1987 | Miller, Jr. et al. .......... 346/108 | 4,982,265 A | 1/1991 | Watanabe et al. ............. 357/75 |
| 4,662,746 A | 5/1987 | Hornbeck ................... 350/269 | 4,984,824 A | 1/1991 | Antes et al. .................. 283/91 |
| 4,663,670 A | 5/1987 | Ito et al. ...................... 358/245 | 4,999,308 A | 3/1991 | Nishiura et al. ............... 437/4 |
| 4,687,326 A | 8/1987 | Corby, Jr. ...................... 356/5 | 5,003,300 A | 3/1991 | Wells ........................ 340/705 |
| 4,698,602 A | 10/1987 | Armitage ................... 332/7.51 | 5,009,473 A | 4/1991 | Hunter et al. ................ 350/6.6 |
| 4,700,276 A | 10/1987 | Freyman et al. ............ 361/403 | 5,013,141 A | 5/1991 | Sakata ....................... 350/348 |
| 4,707,064 A | 11/1987 | Dobrowolski et al. ... 350/96.19 | 5,018,256 A | 5/1991 | Hornbeck .................. 29/25.01 |
| 4,709,995 A | 12/1987 | Kuribayashi et al. ....... 350/350 | 5,022,750 A | 6/1991 | Flasck ........................ 353/31 |
| 4,710,732 A | 12/1987 | Hornbeck ................. 332/7.51 | 5,023,905 A | 6/1991 | Wells et al. .................. 379/96 |
| 4,711,526 A | 12/1987 | Hennings et al. ........... 350/170 | 5,024,494 A | 6/1991 | Williams et al. ............. 350/3.6 |
| 4,714,326 A | 12/1987 | Usui et al. ................... 350/485 | 5,028,939 A | 7/1991 | Hornbeck et al. .......... 346/160 |
| 4,717,066 A | 1/1988 | Goldenberg et al. ........ 228/179 | 5,031,144 A | 7/1991 | Persky |
| 4,719,507 A | 1/1988 | Bos ............................ 358/92 | 5,035,473 A | 7/1991 | Kuwayama et al. ......... 350/3.7 |
| 4,721,629 A | 1/1988 | Sakai et al. ................... 427/35 | 5,037,173 A | 8/1991 | Sampsell et al. ............. 385/17 |
| 4,722,593 A | 2/1988 | Shimazaki ................. 350/336 | 5,039,628 A | 8/1991 | Carey ....................... 437/183 |
| 4,724,467 A | 2/1988 | Yip et al. ...................... 355/71 | 5,040,052 A | 8/1991 | McDavid .................... 357/80 |
| 4,728,185 A | 3/1988 | Thomas ...................... 353/122 | 5,041,395 A | 8/1991 | Steffen ...................... 437/206 |
| 4,743,091 A | 5/1988 | Gelbart ...................... 350/252 | 5,041,851 A | 8/1991 | Nelson ...................... 346/160 |
| 4,744,633 A | 5/1988 | Sheiman ..................... 350/132 | 5,043,917 A | 8/1991 | Okamoto ................... 364/518 |
| 4,747,671 A | 5/1988 | Takahashi et al. .......... 350/336 | 5,048,077 A | 9/1991 | Wells et al. .................. 379/96 |
| 4,751,509 A | 6/1988 | Kubota et al. .............. 340/784 | 5,049,901 A | 9/1991 | Gelbart ...................... 346/108 |
| 4,761,253 A | 8/1988 | Antes ........................ 264/1.3 | 5,058,992 A | 10/1991 | Takahashi .................. 359/567 |
| 4,763,975 A | 8/1988 | Scifres et al. ............ 350/96.15 | 5,060,058 A | 10/1991 | Goldenberg et al. .......... 358/60 |
| 4,765,865 A | 8/1988 | Gealer et al. ............... 156/647 | 5,061,049 A | 10/1991 | Hornbeck .................. 359/224 |
| 4,772,094 A | 9/1988 | Sheiman ..................... 350/133 | 5,066,614 A | 11/1991 | Dunnaway et al. .......... 437/209 |
| 4,797,694 A | 1/1989 | Agostinelli et al. ......... 346/160 | 5,068,205 A | 11/1991 | Baxter et al. ............... 437/205 |
| 4,797,918 A | 1/1989 | Lee et al. ...................... 380/20 | 5,072,239 A | 12/1991 | Mitcham et al. ............ 346/108 |
| 4,801,194 A | 1/1989 | Agostinelli et al. ......... 350/356 | 5,072,418 A | 12/1991 | Boutaud et al. ........ 364/715.06 |
| 4,803,560 A | 2/1989 | Matsunaga et al. .......... 359/236 | 5,074,947 A | 12/1991 | Estes et al. ................ 156/307.3 |
| 4,804,641 A | 2/1989 | Arlt et al. ................... 437/227 | 5,075,940 A | 12/1991 | Kuriyama et al. ......... 29/25.03 |
| 4,807,021 A | 2/1989 | Okumura ..................... 357/75 | 5,079,544 A | 1/1992 | DeMond et al. ............ 340/701 |
| 4,807,965 A | 2/1989 | Garakani ..................... 350/131 | 5,081,617 A | 1/1992 | Gelbart ...................... 369/112 |
| 4,809,078 A | 2/1989 | Yabe et al. .................. 358/236 | 5,083,857 A | 1/1992 | Hornbeck ................... 359/291 |
| 4,811,082 A | 3/1989 | Jacobs et al. ................. 357/80 | 5,085,497 A | 2/1992 | Um et al. ................... 359/848 |
| 4,811,210 A | 3/1989 | McAulay ................... 364/200 | 5,089,903 A | 2/1992 | Kuwayama et al. .......... 359/15 |
| 4,814,759 A | 3/1989 | Gombrich et al. .......... 340/771 | 5,093,281 A | 3/1992 | Eshima ...................... 437/217 |
| 4,817,850 A | 4/1989 | Wiener-Avnear et al. ... 228/119 | 5,096,279 A | 3/1992 | Hornbeck et al. .......... 359/230 |
| 4,824,200 A | 4/1989 | Isono et al. ............... 350/96.16 | 5,099,353 A | 3/1992 | Hornbeck ................... 359/291 |
| 4,827,391 A | 5/1989 | Sills ........................ 363/41 | 5,101,184 A | 3/1992 | Antes ........................ 235/454 |
| 4,829,365 A | 5/1989 | Eichenlaub ................... 358/3 | 5,101,236 A | 3/1992 | Nelson et al. .............. 355/229 |
| 4,836,649 A | 6/1989 | Ledebuhr et al. ....... 350/331 R | 5,103,334 A | 4/1992 | Swanberg ................... 359/197 |
| 4,856,863 A | 8/1989 | Sampsell et al. ......... 350/96.16 | 5,105,207 A | 4/1992 | Nelson ...................... 346/160 |
| 4,856,869 A | 8/1989 | Sakata et al. .......... 350/162.18 | 5,105,299 A | 4/1992 | Anderson et al. ........... 359/223 |
| 4,859,012 A | 8/1989 | Cohn ..................... 350/96.24 | 5,105,369 A | 4/1992 | Nelson ...................... 364/525 |
| 4,859,060 A | 8/1989 | Katagiri et al. ............. 356/352 | 5,107,372 A | 4/1992 | Gelbart et al. .............. 359/824 |
| 4,866,488 A | 9/1989 | Frensley ....................... 357/4 | 5,112,436 A | 5/1992 | Bol ........................... 156/643 |
| 4,882,683 A | 11/1989 | Rupp et al. ................ 364/521 | 5,113,272 A | 5/1992 | Reamey ....................... 359/53 |
| 4,893,509 A | 1/1990 | MacIver et al. ........ 73/517 AV | 5,113,285 A | 5/1992 | Franklin et al. ............ 359/465 |
| 4,896,325 A | 1/1990 | Coldren ...................... 372/20 | 5,115,344 A | 5/1992 | Jaskie ....................... 359/573 |
| 4,896,948 A | 1/1990 | Dono et al. .................. 350/355 | 5,119,204 A | 6/1992 | Hashimoto et al. .......... 358/254 |
| 4,897,708 A | 1/1990 | Clements ..................... 357/65 | 5,121,343 A | 6/1992 | Faris ......................... 395/111 |
| 4,902,083 A | 2/1990 | Wells ........................ 350/6.6 | 5,126,812 A | 6/1992 | Greiff ......................... 357/25 |
| 4,915,463 A | 4/1990 | Barbee, Jr. ................... 350/1.1 | 5,126,826 A | 6/1992 | Kauchi et al. ................ 357/72 |
| 4,915,479 A | 4/1990 | Clarke ........................ 350/345 | 5,126,836 A | 6/1992 | Um ............................ 358/60 |
| 4,924,413 A | 5/1990 | Suwannukul ............... 364/521 | 5,128,660 A | 7/1992 | DeMond et al. ............ 340/707 |
| 4,926,241 A | 5/1990 | Carey ........................ 357/75 | 5,129,716 A | 7/1992 | Holakovszky et al. ......... 351/50 |
| 4,930,043 A | 5/1990 | Wiegand ................... 361/283 | 5,132,723 A | 7/1992 | Gelbart ....................... 355/40 |
| 4,934,773 A | 6/1990 | Becker ....................... 350/6.6 | 5,132,812 A | 7/1992 | Takahashi et al. ............. 359/9 |
| 4,940,309 A | 7/1990 | Baum ........................ 350/171 | 5,136,695 A | 8/1992 | Goldshlag et al. .......... 395/275 |
| 4,943,815 A | 7/1990 | Aldrich et al. ............. 346/108 | 5,137,836 A | 8/1992 | Lam ............................ 437/8 |
| 4,945,773 A | 8/1990 | Sickafus ................... 73/862.59 | 5,142,303 A | 8/1992 | Nelson ...................... 346/108 |
| 4,949,148 A | 8/1990 | Bartelink .................... 357/74 | 5,142,405 A | 8/1992 | Hornbeck ................... 359/226 |
| 4,950,890 A | 8/1990 | Gelbart ................... 250/237 G | 5,142,677 A | 8/1992 | Ehlig et al. ................. 395/650 |
| 4,952,925 A | 8/1990 | Haastert ..................... 340/784 | 5,144,472 A | 9/1992 | Sang, Jr. et al. ............. 359/254 |
| 4,954,789 A | 9/1990 | Sampsell .................... 330/4.3 | 5,147,815 A | 9/1992 | Casto ......................... 437/51 |
| 4,956,619 A | 9/1990 | Hornbeck ................... 330/4.3 | 5,148,157 A | 9/1992 | Florence .................... 340/783 |
| 4,961,633 A | 10/1990 | Ibrahim et al. ............. 350/392 | 5,148,506 A | 9/1992 | McDonald ................... 385/16 |
| 4,963,012 A | 10/1990 | Tracy et al. ................. 350/641 | 5,149,405 A | 9/1992 | Bruns et al. ............. 204/129.1 |
| 4,970,575 A | 11/1990 | Soga et al. .................... 357/72 | 5,150,205 A | 9/1992 | Um et al. ..................... 358/60 |

| | | | | | | |
|---|---|---|---|---|---|---|
| 5,151,718 A | 9/1992 | Nelson ................ 346/160 | | 5,240,818 A | 8/1993 | Mignardi et al. .......... 430/321 |
| 5,151,724 A | 9/1992 | Kikinis ................ 357/17 | | 5,245,686 A | 9/1993 | Faris et al. ................ 385/120 |
| 5,151,763 A | 9/1992 | Marek et al. ............ 357/26 | | 5,247,180 A | 9/1993 | Mitcham et al. ......... 250/492.1 |
| 5,153,770 A | 10/1992 | Harris ................ 359/245 | | 5,247,593 A | 9/1993 | Lin et al. .................... 385/17 |
| 5,155,604 A | 10/1992 | Miekka et al. ............ 359/2 | | 5,249,245 A | 9/1993 | Lebby et al. ............... 385/89 |
| 5,155,615 A | 10/1992 | Tagawa ................ 359/213 | | 5,251,057 A | 10/1993 | Guerin et al. ............ 359/249 |
| 5,155,778 A | 10/1992 | Magel et al. ............ 385/18 | | 5,251,058 A | 10/1993 | MacArthur .............. 359/249 |
| 5,155,812 A | 10/1992 | Ehlig et al. ............ 395/275 | | 5,254,980 A | 10/1993 | Hendrix et al. ............ 345/84 |
| 5,157,304 A | 10/1992 | Kane et al. ............ 313/495 | | 5,255,100 A | 10/1993 | Urbanus .................. 358/231 |
| 5,159,485 A | 10/1992 | Nelson ................ 359/291 | | 5,256,869 A | 10/1993 | Lin et al. ............... 250/201.9 |
| 5,161,042 A | 11/1992 | Hamada ................ 359/41 | | 5,258,325 A | 11/1993 | Spitzer et al. .............. 437/86 |
| 5,162,787 A | 11/1992 | Thompson et al. ........ 340/794 | | 5,260,718 A | 11/1993 | Rommelmann et al. 346/107 R |
| 5,164,019 A | 11/1992 | Sinton ................ 136/249 | | 5,260,798 A | 11/1993 | Um et al. ................ 358/233 |
| 5,165,013 A | 11/1992 | Faris ................ 395/104 | | 5,262,000 A | 11/1993 | Welbourn et al. .......... 156/643 |
| 5,168,401 A | 12/1992 | Endriz ................ 359/625 | | 5,272,473 A | 12/1993 | Thompson et al. ............. 345/7 |
| 5,168,406 A | 12/1992 | Nelson ................ 359/855 | | 5,278,652 A | 1/1994 | Urbanus et al. ............ 358/160 |
| 5,170,156 A | 12/1992 | DeMond et al. ............ 340/794 | | 5,278,925 A | 1/1994 | Boysel et al. ................ 385/14 |
| 5,170,269 A | 12/1992 | Lin et al. ................ 359/9 | | 5,280,277 A | 1/1994 | Hornbeck .................. 345/108 |
| 5,170,283 A | 12/1992 | O'Brien et al. ............ 359/291 | | 5,281,887 A | 1/1994 | Engle ........................ 310/335 |
| 5,172,161 A | 12/1992 | Nelson ................ 355/200 | | 5,281,957 A | 1/1994 | Schoolman .................... 345/8 |
| 5,172,262 A | 12/1992 | Hornbeck ................ 359/223 | | 5,285,105 A | 2/1994 | Cain ........................ 257/672 |
| 5,177,724 A | 1/1993 | Gelbart ................ 369/44.16 | | 5,285,196 A | 2/1994 | Gale, Jr. .................... 345/108 |
| 5,178,728 A | 1/1993 | Boysel et al. ............ 156/656 | | 5,285,407 A | 2/1994 | Gale et al. ............. 365/189.11 |
| 5,179,274 A | 1/1993 | Sampsell ................ 250/208.2 | | 5,287,096 A | 2/1994 | Thompson et al. ......... 345/147 |
| 5,179,367 A | 1/1993 | Shimizu ................ 340/700 | | 5,287,215 A | 2/1994 | Warde et al. .............. 359/293 |
| 5,181,231 A | 1/1993 | Parikh et al. ............ 377/26 | | 5,289,172 A | 2/1994 | Gale, Jr. et al. ........... 345/108 |
| 5,182,665 A | 1/1993 | O'Callaghan et al. ........ 359/95 | | 5,291,317 A | 3/1994 | Newswanger ................ 359/15 |
| 5,185,660 A | 2/1993 | Um ........................ 358/60 | | 5,291,473 A | 3/1994 | Pauli ........................ 369/112 |
| 5,185,823 A | 2/1993 | Kaku et al. | | 5,293,511 A | 3/1994 | Poradish et al. ............ 257/434 |
| 5,188,280 A | 2/1993 | Nakao et al. ............ 228/123 | | 5,296,408 A | 3/1994 | Wilbarg et al. ............ 437/203 |
| 5,189,404 A | 2/1993 | Masimo et al. ............ 340/720 | | 5,296,891 A | 3/1994 | Vogt et al. .................. 355/67 |
| 5,189,505 A | 2/1993 | Bartelink ................ 257/419 | | 5,296,950 A | 3/1994 | Lin et al. .................... 359/9 |
| 5,191,405 A | 3/1993 | Tomita et al. ............ 257/777 | | 5,298,460 A | 3/1994 | Nishiguchi et al. ......... 437/183 |
| 5,192,864 A | 3/1993 | McEwen et al. ............ 250/234 | | 5,299,037 A | 3/1994 | Sakata ...................... 359/41 |
| 5,192,946 A | 3/1993 | Thompson et al. ........ 340/794 | | 5,299,289 A | 3/1994 | Omae et al. .................. 359/95 |
| 5,198,895 A | 3/1993 | Vick ................ 358/103 | | 5,300,813 A | 4/1994 | Joshi et al. ................ 257/752 |
| D334,557 S | 4/1993 | Hunter et al. ............ D14/114 | | 5,301,062 A | 4/1994 | Takahashi et al. ......... 359/567 |
| D334,742 S | 4/1993 | Hunter et al. ............ D14/113 | | 5,303,043 A | 4/1994 | Glenn ........................ 348/40 |
| 5,202,785 A | 4/1993 | Nelson ................ 359/214 | | 5,303,055 A | 4/1994 | Hendrix et al. ............ 348/761 |
| 5,206,629 A | 4/1993 | DeMond et al. ............ 340/719 | | 5,307,056 A | 4/1994 | Urbanus .................... 340/189 |
| 5,206,829 A | 4/1993 | Thakoor et al. | | 5,307,185 A | 4/1994 | Jones et al. .................. 359/41 |
| 5,208,818 A | 5/1993 | Gelbart et al. ............ 372/30 | | 5,310,624 A | 5/1994 | Ehrlich ...................... 430/322 |
| 5,208,891 A | 5/1993 | Prysner ................ 385/116 | | 5,311,349 A | 5/1994 | Anderson et al. ........... 359/223 |
| 5,210,637 A | 5/1993 | Puzey ................ 359/263 | | 5,311,360 A | 5/1994 | Bloom et al. .............. 359/572 |
| 5,212,115 A | 5/1993 | Cho et al. ................ 437/208 | | 5,312,513 A | 5/1994 | Florence et al. ............ 156/643 |
| 5,212,555 A | 5/1993 | Stoltz ................ 358/206 | | 5,313,371 A * | 5/1994 | Knecht et al. .............. 361/818 |
| 5,212,582 A | 5/1993 | Nelson ................ 359/224 | | 5,313,479 A | 5/1994 | Florence .................... 372/26 |
| 5,214,308 A | 5/1993 | Nishiguchi et al. ......... 257/692 | | 5,313,648 A | 5/1994 | Ehlig et al. ................ 395/800 |
| 5,214,419 A | 5/1993 | DeMond et al. ............ 340/794 | | 5,313,835 A | 5/1994 | Dunn ........................ 73/505 |
| 5,214,420 A | 5/1993 | Thompson et al. ......... 340/795 | | 5,315,418 A | 5/1994 | Sprague et al. .............. 359/41 |
| 5,216,278 A | 6/1993 | Lin et al. | | 5,315,423 A | 5/1994 | Hong ........................ 359/124 |
| 5,216,537 A | 6/1993 | Hornbeck ................ 359/291 | | 5,319,214 A | 6/1994 | Gregory et al. ......... 250/504 R |
| 5,216,544 A | 6/1993 | Horikawa et al. ........ 359/622 | | 5,319,668 A | 6/1994 | Luecke ...................... 372/107 |
| 5,219,794 A | 6/1993 | Satoh et al. ............ 437/209 | | 5,319,789 A | 6/1994 | Ehlig et al. ................ 395/800 |
| 5,220,200 A | 6/1993 | Blanton ................ 257/778 | | 5,319,792 A | 6/1994 | Ehlig et al. ................ 395/800 |
| 5,221,400 A | 6/1993 | Staller et al. ............ 156/292 | | 5,320,709 A | 6/1994 | Bowden et al. |
| 5,221,982 A | 6/1993 | Faris ................ 359/93 | | 5,321,416 A | 6/1994 | Bassett et al. ................ 345/8 |
| 5,224,088 A | 6/1993 | Atiya ................ 369/97 | | 5,323,002 A | 6/1994 | Sampsell et al. ......... 250/252.1 |
| D337,320 S | 7/1993 | Hunter et al. ............ D14/113 | | 5,323,051 A | 6/1994 | Adams et al. .............. 254/417 |
| 5,226,099 A | 7/1993 | Mignardi et al. ........... 385/19 | | 5,325,116 A | 6/1994 | Sampsell .................. 346/108 |
| 5,230,005 A | 7/1993 | Rubino et al. ............ 372/20 | | 5,327,286 A | 7/1994 | Sampsell et al. ........... 359/561 |
| 5,231,363 A | 7/1993 | Sano et al. ............ 332/109 | | 5,329,289 A | 7/1994 | Sakamoto et al. ........... 345/126 |
| 5,231,388 A | 7/1993 | Stoltz ................ 340/783 | | 5,330,301 A | 7/1994 | Brancher .................... 414/417 |
| 5,231,432 A | 7/1993 | Glenn ................ 353/31 | | 5,330,878 A | 7/1994 | Nelson ...................... 430/311 |
| 5,233,456 A | 8/1993 | Nelson ................ 359/214 | | 5,331,454 A | 7/1994 | Hornbeck .................. 359/224 |
| 5,233,460 A | 8/1993 | Partlo et al. ............ 359/247 | | 5,334,991 A | 8/1994 | Wells et al. .................. 345/8 |
| 5,233,874 A | 8/1993 | Putty et al. ............ 73/517 AV | | 5,339,116 A | 8/1994 | Urbanus et al. ............ 348/716 |
| 5,237,340 A | 8/1993 | Nelson ................ 346/108 | | 5,339,177 A | 8/1994 | Jenkins et al. .............. 359/35 |
| 5,237,435 A | 8/1993 | Kurematsu et al. ........ 359/41 | | 5,340,772 A | 8/1994 | Rosotker .................... 438/226 |
| 5,239,448 A | 8/1993 | Perkins et al. ............ 361/764 | | 5,345,521 A | 9/1994 | McDonald et al. .......... 385/19 |
| 5,239,806 A | 8/1993 | Maslakow ................ 53/432 | | 5,347,321 A | 9/1994 | Gove ........................ 348/663 |

| | | | | | | | |
|---|---|---|---|---|---|---|---|
| 5,347,378 A | | 9/1994 | Handschy et al. ............ 359/53 | 5,459,528 A | | 10/1995 | Pettitt .......... 348/568 |
| 5,347,433 A | | 9/1994 | Sedlmayr .................... 362/32 | 5,459,592 A | | 10/1995 | Shibatani et al. .......... 359/40 |
| 5,348,619 A | | 9/1994 | Bohannon et al. .......... 156/664 | 5,459,610 A | | 10/1995 | Bloom et al. .............. 359/572 |
| 5,349,687 A | | 9/1994 | Ehlig et al. ................. 395/800 | 5,461,197 A | | 10/1995 | Hiruta et al. .............. 174/52.4 |
| 5,351,052 A | | 9/1994 | D'Hont et al. ................ 342/42 | 5,461,410 A | | 10/1995 | Venkateswar et al. ...... 347/240 |
| 5,352,926 A | | 10/1994 | Andrews .................... 257/717 | 5,461,411 A | | 10/1995 | Florence et al. ............ 347/240 |
| 5,354,416 A | | 10/1994 | Okudaira ................... 156/643 | 5,461,547 A | | 10/1995 | Ciupke et al. ................ 362/31 |
| 5,357,369 A | | 10/1994 | Pilling et al. ............... 359/462 | 5,463,347 A | | 10/1995 | Jones et al. ................ 330/253 |
| 5,357,803 A | | 10/1994 | Lane ....................... 73/517 B | 5,463,497 A | | 10/1995 | Muraki et al. .............. 359/618 |
| 5,359,349 A | | 10/1994 | Jambor et al. ............. 345/168 | 5,465,175 A | | 11/1995 | Woodgate et al. .......... 359/463 |
| 5,359,451 A | | 10/1994 | Gelbart et al. .............. 356/285 | 5,467,106 A | | 11/1995 | Salomon ..................... 345/87 |
| 5,361,131 A | | 11/1994 | Tekemori et al. .......... 356/355 | 5,467,138 A | | 11/1995 | Gove ........................ 348/452 |
| 5,363,220 A | | 11/1994 | Kuwayama et al. .......... 359/3 | 5,467,146 A | | 11/1995 | Huang et al. .............. 348/743 |
| 5,365,283 A | | 11/1994 | Doherty et al. ............. 348/743 | 5,469,302 A | | 11/1995 | Lim ......................... 359/846 |
| 5,367,585 A | | 11/1994 | Ghezzo et al. ................ 385/23 | 5,471,341 A | | 11/1995 | Warde et al. ............... 359/293 |
| 5,370,742 A | | 12/1994 | Mitchell et al. .............. 134/10 | 5,473,512 A | | 12/1995 | Degani et al. .............. 361/760 |
| 5,371,543 A | | 12/1994 | Anderson ................... 348/270 | 5,475,236 A | | 12/1995 | Yoshizaki ................... 257/48 |
| 5,371,618 A | | 12/1994 | Tai et al. .................... 359/53 | 5,480,839 A | | 1/1996 | Ezawa et al. .............. 437/209 |
| 5,377,705 A | | 1/1995 | Smith, Jr. et al. .......... 134/95.3 | 5,481,118 A | | 1/1996 | Tew ......................... 250/551 |
| 5,382,961 A | | 1/1995 | Gale, Jr. .................... 345/108 | 5,481,133 A | | 1/1996 | Hsu ......................... 257/621 |
| 5,387,924 A | | 2/1995 | Gale, Jr. et al. ............. 345/108 | 5,482,564 A | | 1/1996 | Douglas et al. .............. 134/18 |
| 5,389,182 A | | 2/1995 | Mignardi ................... 156/344 | 5,482,818 A | | 1/1996 | Nelson ...................... 430/394 |
| 5,391,881 A | | 2/1995 | Jeuch et al. ............ 250/370.09 | 5,483,307 A | | 1/1996 | Anderson .................... 353/98 |
| 5,392,140 A | | 2/1995 | Ezra et al. ................... 359/41 | 5,485,172 A | | 1/1996 | Sawachika et al. ........... 345/8 |
| 5,392,151 A | | 2/1995 | Nelson ....................... 359/223 | 5,485,304 A | | 1/1996 | Kaeriyama ................. 359/291 |
| 5,394,303 A | | 2/1995 | Yamaji ...................... 361/749 | 5,485,354 A | | 1/1996 | Ciupke et al. ................ 362/31 |
| 5,398,071 A | | 3/1995 | Gove et al. ................. 348/558 | 5,486,698 A | | 1/1996 | Hanson et al. .............. 250/332 |
| 5,399,898 A | | 3/1995 | Rostoker .................... 257/499 | 5,486,841 A | | 1/1996 | Hara et al. .................... 345/8 |
| 5,404,365 A | | 4/1995 | Hiiro ......................... 372/27 | 5,486,946 A | | 1/1996 | Jachimowicz et al. ...... 359/263 |
| 5,404,485 A | | 4/1995 | Ban .......................... 395/425 | 5,488,431 A | | 1/1996 | Gove et al. ................. 348/716 |
| 5,408,123 A | | 4/1995 | Murai ........................ 257/531 | 5,489,952 A | | 2/1996 | Gove et al. ................. 348/771 |
| 5,410,315 A | | 4/1995 | Huber ........................ 342/42 | 5,490,009 A | | 2/1996 | Venkateswar et al. ...... 359/291 |
| 5,411,769 A | | 5/1995 | Hornbeck ................... 427/534 | 5,491,510 A | | 2/1996 | Gove .......................... 348/77 |
| 5,412,186 A | | 5/1995 | Gale ......................... 219/679 | 5,491,612 A | | 2/1996 | Nicewarner, Jr. ............ 361/760 |
| 5,412,501 A | | 5/1995 | Fisli .......................... 359/286 | 5,491,715 A | | 2/1996 | Flaxl ........................ 375/344 |
| 5,412,748 A | * | 5/1995 | Furuyama et al. ............ 385/92 | 5,493,177 A | | 2/1996 | Muller et al. ............... 313/578 |
| 5,418,584 A | | 5/1995 | Larson ...................... 353/122 | 5,493,439 A | | 2/1996 | Engle ........................ 359/292 |
| 5,420,655 A | | 5/1995 | Shimizu ...................... 353/33 | 5,497,172 A | | 3/1996 | Doherty et al. .............. 345/85 |
| 5,420,722 A | | 5/1995 | Bielak ....................... 359/708 | 5,497,197 A | | 3/1996 | Gove et al. ................. 348/388 |
| 5,426,072 A | | 6/1995 | Finnila ...................... 437/208 | 5,497,262 A | | 3/1996 | Kaeriyama ................. 359/223 |
| 5,427,975 A | | 6/1995 | Sparks et al. ................ 437/79 | 5,499,060 A | | 3/1996 | Gove et al. ................. 348/651 |
| 5,430,524 A | | 7/1995 | Nelson ....................... 355/200 | 5,499,062 A | | 3/1996 | Urbanus .................... 348/771 |
| 5,435,876 A | | 7/1995 | Alfaro et al. ............... 156/247 | 5,500,761 A | | 3/1996 | Goossen et al. ............ 359/290 |
| 5,438,477 A | | 8/1995 | Pasch ....................... 361/689 | 5,502,481 A | | 3/1996 | Dentinger et al. ............ 348/51 |
| 5,439,731 A | | 8/1995 | Li et al. ..................... 428/209 | 5,504,504 A | | 4/1996 | Markandey et al. ......... 345/214 |
| 5,442,411 A | | 8/1995 | Urbanus et al. ............. 348/771 | 5,504,514 A | | 4/1996 | Nelson ...................... 347/130 |
| 5,442,414 A | | 8/1995 | Janssen et al. ................ 353/98 | 5,504,575 A | | 4/1996 | Stafford .................... 356/330 |
| 5,444,566 A | | 8/1995 | Gale et al. .................. 359/291 | 5,504,614 A | | 4/1996 | Webb et al. ................. 359/223 |
| 5,445,559 A | | 8/1995 | Gale et al. .................. 451/388 | 5,506,171 A | | 4/1996 | Leonard et al. ............. 437/187 |
| 5,446,479 A | | 8/1995 | Thompson et al. .......... 345/139 | 5,506,597 A | | 4/1996 | Thompson et al. ........... 345/85 |
| 5,447,600 A | | 9/1995 | Webb ......................... 216/2 | 5,506,720 A | | 4/1996 | Yoon ........................ 359/224 |
| 5,448,314 A | | 9/1995 | Heimbuch et al. .......... 348/743 | 5,508,558 A | | 4/1996 | Robinette, Jr. et al. ..... 257/700 |
| 5,448,546 A | | 9/1995 | Pauli ........................ 369/112 | 5,508,561 A | | 4/1996 | Tago et al. .................. 257/737 |
| 5,450,088 A | | 9/1995 | Meier et al. ................. 342/51 | 5,508,565 A | | 4/1996 | Hatakeyama et al. ........ 257/777 |
| 5,450,219 A | | 9/1995 | Gold et al. .................... 359/40 | 5,508,750 A | | 4/1996 | Hewlett et al. ............. 348/558 |
| 5,451,103 A | | 9/1995 | Hatanaka et al. ............ 353/31 | 5,508,840 A | | 4/1996 | Vogel et al. ................. 359/291 |
| 5,452,024 A | | 9/1995 | Sampsell .................... 348/755 | 5,508,841 A | | 4/1996 | Lin et al. .................... 359/318 |
| 5,452,138 A | | 9/1995 | Mignardi et al. ........... 359/855 | 5,510,758 A | | 4/1996 | Fujita et al. ................. 333/247 |
| 5,453,747 A | | 9/1995 | D'Hont et al. ............... 342/42 | 5,510,824 A | | 4/1996 | Nelson ...................... 347/239 |
| 5,453,778 A | | 9/1995 | Venkateswar et al. ...... 347/239 | 5,512,374 A | | 4/1996 | Wallace et al. ............. 428/422 |
| 5,453,803 A | | 9/1995 | Shapiro et al. .............. 353/119 | 5,512,748 A | | 4/1996 | Hanson ..................... 250/332 |
| 5,454,160 A | | 10/1995 | Nickel ........................ 29/840 | 5,515,076 A | | 5/1996 | Thompson et al. .......... 345/139 |
| 5,454,906 A | | 10/1995 | Baker et al. .................. 216/66 | 5,516,125 A | | 5/1996 | McKenna ..................... 279/3 |
| 5,455,445 A | | 10/1995 | Kurtz et al. ................. 257/419 | 5,517,340 A | | 5/1996 | Doany et al. ................ 359/41 |
| 5,455,455 A | | 10/1995 | Badehi ...................... 257/690 | 5,517,347 A | | 5/1996 | Sampsell ................... 359/224 |
| 5,455,602 A | | 10/1995 | Tew .......................... 347/239 | 5,517,357 A | | 5/1996 | Shibayama ................. 359/547 |
| 5,457,493 A | | 10/1995 | Leddy et al. ................ 348/164 | 5,517,359 A | | 5/1996 | Gelbart ..................... 359/623 |
| 5,457,566 A | | 10/1995 | Sampsell et al. ............ 359/292 | 5,519,251 A | | 5/1996 | Sato et al. .................. 257/666 |
| 5,457,567 A | | 10/1995 | Shinohara .................. 359/305 | 5,519,450 A | | 5/1996 | Urbanus et al. ............. 348/600 |
| 5,458,716 A | | 10/1995 | Alfaro et al. ............... 156/245 | 5,521,748 A | | 5/1996 | Sarraf ....................... 359/321 |
| 5,459,492 A | | 10/1995 | Venkateswar ............... 347/253 | 5,523,619 A | | 6/1996 | McAllister et al. .......... 257/686 |

| Patent No. | Date | Inventor | Class |
|---|---|---|---|
| 5,523,628 A | 6/1996 | Williams et al. | 257/777 |
| 5,523,803 A | 6/1996 | Urbanus et al. | 348/771 |
| 5,523,878 A | 6/1996 | Wallace et al. | 359/290 |
| 5,523,881 A | 6/1996 | Florence et al. | 359/561 |
| 5,523,920 A | 6/1996 | Machuga et al. | 361/767 |
| 5,524,155 A | 6/1996 | Weaver | 385/24 |
| 5,526,834 A | 6/1996 | Mielnik et al. | 134/105 |
| 5,534,107 A | 7/1996 | Gray et al. | 156/643.1 |
| 5,534,883 A | 7/1996 | Koh | 345/3 |
| 5,539,422 A | 7/1996 | Heacock et al. | 345/8 |
| 5,544,306 A | 8/1996 | Deering et al. | 395/164 |
| 5,552,635 A | 9/1996 | Kim et al. | |
| 5,554,304 A | 9/1996 | Suzuki | 216/2 |
| 5,576,878 A | 11/1996 | Henck | 359/224 |
| 5,602,671 A | 2/1997 | Hornbeck | 359/224 |
| 5,606,181 A | 2/1997 | Sakuma et al. | 257/88 |
| 5,606,447 A | 2/1997 | Asada et al. | 359/199 |
| 5,610,438 A | 3/1997 | Wallace et al. | 257/682 |
| 5,623,361 A | 4/1997 | Engle | 359/291 |
| 5,629,566 A | 5/1997 | Doi et al. | 257/789 |
| 5,629,801 A | 5/1997 | Staker et al. | 359/572 |
| 5,640,216 A | 6/1997 | Hasegawa et al. | 349/58 |
| 5,658,698 A | 8/1997 | Yagi et al. | 430/11 |
| 5,661,592 A | 8/1997 | Bornstein et al. | 359/291 |
| 5,661,593 A | 8/1997 | Engle | 359/292 |
| 5,663,817 A | 9/1997 | Frapin et al. | 349/5 |
| 5,668,611 A | 9/1997 | Ernstoff et al. | 348/771 |
| 5,673,139 A | 9/1997 | Johnson | 359/291 |
| 5,677,783 A | 10/1997 | Bloom et al. | 359/224 |
| 5,689,361 A | 11/1997 | Damen et al. | 359/284 |
| 5,691,836 A | 11/1997 | Clark | 359/247 |
| 5,694,740 A | 12/1997 | Martin et al. | 53/431 |
| 5,696,560 A | 12/1997 | Songer | 348/436 |
| 5,699,740 A | 12/1997 | Gelbart | 101/477 |
| 5,704,700 A | 1/1998 | Kappel et al. | 353/31 |
| 5,707,160 A | 1/1998 | Bowen | 400/472 |
| 5,712,649 A | 1/1998 | Tosaki | 345/8 |
| 5,713,652 A | 2/1998 | Zavracky et al. | 353/122 |
| 5,719,979 A * | 2/1998 | Furuyama | 385/89 |
| 5,726,480 A | 3/1998 | Pister | 257/415 |
| 5,731,802 A | 3/1998 | Aras et al. | 345/148 |
| 5,734,224 A | 3/1998 | Tagawa et al. | 313/493 |
| 5,742,373 A | 4/1998 | Alvelda | 349/204 |
| 5,744,752 A * | 4/1998 | McHerron et al. | 174/52.4 |
| 5,745,271 A | 4/1998 | Ford et al. | 359/130 |
| 5,757,354 A | 5/1998 | Kawamura | 345/126 |
| 5,757,536 A | 5/1998 | Ricco et al. | 359/224 |
| 5,764,280 A | 6/1998 | Bloom et al. | 348/53 |
| 5,768,009 A | 6/1998 | Little | 359/293 |
| 5,770,473 A | 6/1998 | Hall et al. | 438/26 |
| 5,793,519 A | 8/1998 | Furlani et al. | 359/291 |
| 5,798,743 A | 8/1998 | Bloom | 345/90 |
| 5,798,805 A | 8/1998 | Ooi et al. | 349/10 |
| 5,801,074 A | 9/1998 | Kim et al. | 438/125 |
| 5,802,222 A | 9/1998 | Rasch et al. | 385/1 |
| 5,808,323 A | 9/1998 | Spaeth et al. | 257/88 |
| 5,808,797 A | 9/1998 | Bloom et al. | 359/572 |
| 5,815,126 A | 9/1998 | Fan et al. | 345/8 |
| 5,825,443 A | 10/1998 | Kawasaki et al. | 349/95 |
| 5,832,148 A | 11/1998 | Yariv | |
| 5,835,255 A | 11/1998 | Miles | 359/291 |
| 5,835,256 A | 11/1998 | Huibers | 359/291 |
| 5,837,562 A | 11/1998 | Cho | 438/51 |
| 5,841,579 A | 11/1998 | Bloom et al. | 359/572 |
| 5,841,929 A | 11/1998 | Komatsu et al. | |
| 5,844,711 A | 12/1998 | Long, Jr. | 359/291 |
| 5,847,859 A | 12/1998 | Murata | 359/201 |
| 5,862,164 A | 1/1999 | Hill | 372/27 |
| 5,868,854 A | 2/1999 | Kojima et al. | 134/1.3 |
| 5,886,675 A | 3/1999 | Aye et al. | 345/7 |
| 5,892,505 A | 4/1999 | Tropper | 345/208 |
| 5,895,233 A | 4/1999 | Higashi et al. | 438/107 |
| 5,898,515 A | 4/1999 | Furlani et al. | 359/290 |
| 5,903,243 A | 5/1999 | Jones | 345/7 |
| 5,903,395 A | 5/1999 | Rallison et al. | 359/630 |
| 5,904,737 A | 5/1999 | Preston et al. | 8/158 |
| 5,910,856 A | 6/1999 | Ghosh et al. | 359/291 |
| 5,912,094 A | 6/1999 | Aksyuk et al. | 430/5 |
| 5,912,608 A | 6/1999 | Asada | 335/222 |
| 5,914,801 A | 6/1999 | Dhuler et al. | 359/230 |
| 5,915,168 A | 6/1999 | Salatino et al. | 438/110 |
| 5,919,548 A | 7/1999 | Barron et al. | 428/138 |
| 5,920,411 A | 7/1999 | Duck et al. | 359/127 |
| 5,920,418 A | 7/1999 | Shiono et al. | 359/246 |
| 5,923,475 A | 7/1999 | Kurtz et al. | 359/619 |
| 5,926,309 A | 7/1999 | Little | 359/293 |
| 5,926,318 A | 7/1999 | Hebert | 359/618 |
| 5,942,791 A | 8/1999 | Shorrocks et al. | 257/522 |
| 5,949,390 A | 9/1999 | Nomura et al. | 345/32 |
| 5,949,570 A | 9/1999 | Shiono et al. | 359/291 |
| 5,953,161 A | 9/1999 | Troxell et al. | 359/618 |
| 5,955,771 A | 9/1999 | Kurtz et al. | 257/419 |
| 5,963,788 A | 10/1999 | Barron et al. | 438/48 |
| 5,978,127 A | 11/1999 | Berg | 359/279 |
| 5,982,553 A | 11/1999 | Bloom et al. | 359/627 |
| 5,986,634 A | 11/1999 | Alioshin | 345/126 |
| 5,986,796 A | 11/1999 | Miles | 359/260 |
| 5,995,303 A | 11/1999 | Honguh et al. | 359/708 |
| 5,999,319 A | 12/1999 | Castracane | 359/573 |
| 6,004,912 A | 12/1999 | Gudeman | 508/577 |
| 6,012,336 A | 1/2000 | Eaton et al. | |
| 6,016,222 A | 1/2000 | Setani et al. | 359/571 |
| 6,025,859 A | 2/2000 | Ide et al. | 347/135 |
| 6,036,375 A * | 3/2000 | Yanagisawa et al. | 385/94 |
| 6,038,057 A | 3/2000 | Brazas, Jr. et al. | 359/291 |
| 6,040,748 A | 3/2000 | Gueissaz | 335/78 |
| 6,046,840 A | 4/2000 | Huibers | 359/291 |
| 6,055,090 A | 4/2000 | Miles | 359/291 |
| 6,057,520 A | 5/2000 | Goodwin-Johansson | 200/181 |
| 6,061,166 A | 5/2000 | Furlani et al. | 359/254 |
| 6,061,489 A | 5/2000 | Ezra | 385/115 |
| 6,062,461 A | 5/2000 | Sparks et al. | 228/123.1 |
| 6,064,404 A | 5/2000 | Aras et al. | 345/507 |
| 6,069,392 A | 5/2000 | Tai et al. | 257/419 |
| 6,071,652 A | 6/2000 | Feldman et al. | 430/5 |
| 6,075,632 A | 6/2000 | Braun | 359/124 |
| 6,084,626 A | 7/2000 | Ramanujan et al. | 347/239 |
| 6,088,102 A | 7/2000 | Manhart | 356/354 |
| 6,090,717 A | 7/2000 | Powell et al. | 438/710 |
| 6,091,521 A | 7/2000 | Popovich | 359/15 |
| 6,096,576 A | 8/2000 | Corbin et al. | 438/108 |
| 6,096,656 A | 8/2000 | Matzke et al. | |
| 6,097,352 A | 8/2000 | Zavracky et al. | 345/7 |
| 6,101,036 A | 8/2000 | Bloom | 359/567 |
| 6,115,168 A | 9/2000 | Zhao et al. | 359/247 |
| 6,122,299 A | 9/2000 | DeMars et al. | 372/20 |
| 6,123,985 A | 9/2000 | Robinson et al. | 427/162 |
| 6,124,145 A | 9/2000 | Stemme et al. | 438/26 |
| 6,130,770 A | 10/2000 | Bloom | 359/224 |
| 6,144,481 A | 11/2000 | Kowarz et al. | 359/291 |
| 6,147,789 A | 11/2000 | Gelbart | 359/231 |
| 6,154,259 A | 11/2000 | Hargis et al. | 348/756 |
| 6,163,026 A | 12/2000 | Bawolek et al. | 250/351 |
| 6,163,402 A | 12/2000 | Chou et al. | 359/443 |
| 6,169,624 B1 | 1/2001 | Godil et al. | 359/237 |
| 6,172,796 B1 | 1/2001 | Kowarz et al. | 359/290 |
| 6,172,797 B1 | 1/2001 | Huibers | 359/291 |
| 6,177,980 B1 | 1/2001 | Johnson | 355/67 |
| 6,181,458 B1 | 1/2001 | Brazas, Jr. et al. | 359/290 |
| 6,188,519 B1 | 2/2001 | Johnson | 359/572 |
| 6,195,196 B1 | 2/2001 | Kimura et al. | 359/295 |
| 6,197,610 B1 | 3/2001 | Toda | 438/50 |

| | | | |
|---|---|---|---|
| 6,210,988 B1 | 4/2001 | Howe et al. ............... 438/50 |
| 6,215,579 B1 | 4/2001 | Bloom et al. ............. 359/298 |
| 6,219,015 B1 | 4/2001 | Bloom et al. ............. 345/87 |
| 6,222,954 B1 | 4/2001 | Riza ....................... 385/18 |
| 6,229,650 B1 | 5/2001 | Reznichenko et al. ...... 359/566 |
| 6,229,683 B1 | 5/2001 | Goodwin-Johansson .... 361/233 |
| 6,241,143 B1 | 6/2001 | Kuroda .................... 228/110.1 |
| 6,249,381 B1 | 6/2001 | Suganuma |
| 6,251,842 B1 | 6/2001 | Gudeman ................. 508/577 |
| 6,252,697 B1 | 6/2001 | Hawkins et al. ........... 359/290 |
| 6,254,792 B1 | 7/2001 | Van Buskirk et al. ...... 216/13 |
| 6,261,494 B1 | 7/2001 | Zavracky et al. .......... 264/104 |
| 6,268,952 B1 | 7/2001 | Godil et al. .............. 359/291 |
| 6,271,145 B1 | 8/2001 | Toda ....................... 438/706 |
| 6,271,808 B1 | 8/2001 | Corbin .................... 345/7 |
| 6,274,469 B1 | 8/2001 | Yu ......................... 438/592 |
| 6,282,213 B1 | 8/2001 | Gutin et al. |
| 6,286,231 B1 | 9/2001 | Bergman et al. ........... 34/410 |
| 6,290,859 B1 | 9/2001 | Fleming et al. ............ 216/2 |
| 6,290,864 B1 | 9/2001 | Patel et al. ............... 216/79 |
| 6,300,148 B1 | 10/2001 | Birdsley et al. ............ 438/15 |
| 6,303,986 B1 | 10/2001 | Shook ..................... 257/680 |
| 6,310,018 B1 | 10/2001 | Behr et al. ............... 510/175 |
| 6,313,901 B1 | 11/2001 | Cacharelis |
| 6,323,984 B1 | 11/2001 | Trisnadi .................. 359/245 |
| 6,327,071 B1 | 12/2001 | Kimura .................... 359/291 |
| 6,342,960 B1 | 1/2002 | McCullough ............. 359/124 |
| 6,346,430 B1 | 2/2002 | Raj et al. |
| 6,356,577 B1 | 3/2002 | Miller ..................... 372/107 |
| 6,356,689 B1 | 3/2002 | Greywall .................. 385/52 |
| 6,359,333 B1 | 3/2002 | Wood et al. .............. 257/704 |
| 6,384,959 B1 | 5/2002 | Furlani et al. ............. 359/291 |
| 6,387,723 B1 | 5/2002 | Payne et al. .............. 438/48 |
| 6,388,203 B1 * | 5/2002 | Rinne et al. .............. 174/261 |
| 6,392,309 B1 | 5/2002 | Wataya et al. ............ 257/796 |
| 6,396,789 B1 | 5/2002 | Guerra et al. ............. 369/112 |
| 6,418,152 B1 | 7/2002 | Davis |
| 6,421,179 B1 | 7/2002 | Gutin et al. .............. 359/572 |
| 6,445,502 B1 | 9/2002 | Islam et al. .............. 359/571 |
| 6,452,260 B1 | 9/2002 | Corbin et al. ............. 257/686 |
| 6,466,354 B1 | 10/2002 | Gudeman ................. 359/247 |
| 6,479,811 B1 | 11/2002 | Kruschwitz et al. |
| 6,480,634 B1 | 11/2002 | Corrigan .................. 385/4 |
| 6,497,490 B1 | 12/2002 | Miller ..................... 359/614 |
| 6,525,863 B1 | 2/2003 | Riza ....................... 359/290 |
| 6,563,974 B2 | 5/2003 | Riza ....................... 385/18 |
| 6,565,222 B1 | 5/2003 | Ishii et al. ............... 359/883 |
| 6,569,717 B1 | 5/2003 | Murade |
| 2001/0019454 A1 | 9/2001 | Tadic-Galeb et al. ....... 359/649 |
| 2002/0015230 A1 | 2/2002 | Pilossof et al. ............ 359/558 |
| 2002/0021485 A1 | 2/2002 | Pilossof ................... 359/295 |
| 2002/0079432 A1 | 6/2002 | Lee et al. ................. 250/216 |
| 2002/0105725 A1 | 8/2002 | Sweatt et al. ............. 359/566 |
| 2002/0112746 A1 | 8/2002 | DeYoung et al. .......... 134/36 |
| 2002/0131228 A1 | 9/2002 | Potter |
| 2002/0131230 A1 | 9/2002 | Potter ..................... 361/277 |
| 2002/0135708 A1 | 9/2002 | Murden et al. |
| 2002/0176151 A1 | 11/2002 | Moon et al. |
| 2002/0195418 A1 | 12/2002 | Kowarz et al. |
| 2002/0196492 A1 | 12/2002 | Trisnadi et al. |
| 2003/0056078 A1 | 3/2003 | Johansson et al. |

FOREIGN PATENT DOCUMENTS

| | | | |
|---|---|---|---|
| EP | 0 322 714 A2 | 7/1989 | ........... G02B/5/30 |
| EP | 0 627 644 A3 | 9/1990 | ........... G02B/27/00 |
| EP | 0 417 039 A1 | 3/1991 | ........... G03B/21/20 |
| EP | 0 423 513 A2 | 4/1991 | ........... H01S/3/085 |
| EP | 0 436 738 A1 | 7/1991 | ........... H04N/5/74 |
| EP | 0 458 316 A2 | 11/1991 | ........... G06K/11/06 |
| EP | 459439 A2 * | 12/1991 | ........... H01L/21/50 |
| EP | 0 477 566 A2 | 4/1992 | ........... G02B/26/08 |
| EP | 0 488 326 A3 | 6/1992 | ........... G09G/3/28 |
| EP | 0 499 566 A2 | 8/1992 | ........... G06F/3/033 |
| EP | 0 528 646 A1 | 2/1993 | ........... G09G/3/02 |
| EP | 0 530 760 A2 | 3/1993 | ........... G09G/3/34 |
| EP | 0 550 189 A1 | 7/1993 | ........... G02F/1/315 |
| EP | 0 610 665 A1 | 8/1994 | ........... G09G/3/34 |
| EP | 0 627 644 A2 | 12/1994 | ........... G02B/27/00 |
| EP | 0 627 850 A1 | 12/1994 | ........... H04N/5/64 |
| EP | 0 643 314 A2 | 3/1995 | ........... G02B/27/00 |
| EP | 0 654 777 A1 | 5/1995 | ........... G09G/3/34 |
| EP | 0 658 868 A1 | 6/1995 | ........... G09G/3/34 |
| EP | 0 658 830 A1 | 12/1995 | ........... G09G/3/34 |
| EP | 0 689 078 A1 | 12/1995 | ........... G02B/26/08 |
| EP | 0 801 319 A1 | 10/1997 | ........... G02B/26/00 |
| EP | 0 851 492 A2 | 7/1998 | ........... H01L/23/538 |
| EP | 1 003 071 A2 | 5/2000 | ........... G03B/27/72 |
| EP | 1 014 143 A1 | 6/2000 | ........... G02B/26/08 |
| EP | 1 040 927 A2 | 10/2000 | ........... B41J/2/455 |
| GB | 2 117 564 A | 10/1983 | ........... H01L/25/08 |
| GB | 2 118 365 A | 10/1983 | ........... H01L/27/13 |
| GB | 2 266 385 A | 10/1993 | ........... G02B/23/10 |
| GB | 2 296 152 A | 6/1996 | ........... H04N/13/04 |
| GB | 2 319 424 A | 5/1998 | ........... H04N/13/04 |
| JP | 53-39068 | 4/1978 | ........... H01L/23/12 |
| JP | 55-111151 | 8/1980 | ........... H01L/27/00 |
| JP | 57-31166 | 2/1982 | ........... H01L/23/48 |
| JP | 57-210638 | 12/1982 | ........... H01L/21/60 |
| JP | 60-49638 | 3/1985 | ........... H01L/21/60 |
| JP | 60-94756 | 5/1985 | ........... H01L/25/04 |
| JP | 60-250639 | 12/1985 | ........... H01L/21/58 |
| JP | 61-142750 | 6/1986 | ........... H01L/21/60 |
| JP | 61-145838 | 7/1986 | ........... H01L/21/60 |
| JP | 63-234767 | 9/1988 | ........... H04N/1/04 |
| JP | 63-305323 | 12/1988 | ........... G02F/1/13 |
| JP | 1-155637 | 6/1989 | ........... H01L/21/66 |
| JP | 40-1155637 | 6/1989 | ........... H01L/21/92 |
| JP | 2219092 | 8/1990 | ........... G09G/3/28 |
| JP | 4-333015 | 11/1992 | ........... G02B/27/18 |
| JP | 7-281161 | 10/1995 | ........... G02F/1/1333 |
| JP | 3288369 | 3/2002 | ........... G02B/26/06 |
| WO | WO 90/13913 | 11/1990 | ........... H01L/23/10 |
| WO | WO 92/12506 | 7/1992 | ........... G09F/9/37 |
| WO | WO 93/02269 | 2/1993 | ........... E06B/5/10 |
| WO | WO 93/09472 | 5/1993 | ........... G03F/7/20 |
| WO | WO 93/18428 | 9/1993 | |
| WO | WO 93/22694 | 11/1993 | ........... G02B/5/18 |
| WO | WO 94/09473 | 4/1994 | ........... G09G/3/34 |
| WO | WO 94/29761 | 12/1994 | ........... G02B/27/24 |
| WO | WO 95/11473 | 4/1995 | ........... G02B/27/00 |
| WO | WO 96/02941 | 2/1996 | ........... H01L/23/02 |
| WO | WO 96/08031 | 3/1996 | ........... H01J/29/12 |
| WO | WO 96/41217 | 12/1996 | ........... G02B/5/18 |
| WO | WO 96/41224 | 12/1996 | ........... G02B/19/00 |
| WO | WO 97/22033 | 6/1997 | ........... G02B/27/22 |
| WO | WO 97/26569 | 7/1997 | ........... G02B/5/18 |
| WO | WO 98/05935 | 2/1998 | ........... G01L/9/06 |
| WO | WO 98/24240 | 6/1998 | ........... H04N/9/31 |
| WO | WO 98/41893 | 9/1998 | ........... G02B/26/08 |
| WO | WO 99/07146 | 2/1999 | ........... H04N/7/16 |
| WO | WO 99/12208 | 3/1999 | ........... H01L/25/065 |
| WO | WO 99/23520 | 5/1999 | ........... G02B/26/08 |
| WO | WO 99/34484 | 7/1999 | |
| WO | WO 99/59335 | 11/1999 | ........... H04N/5/765 |
| WO | WO 99/63388 | 12/1999 | ........... G02B/27/22 |
| WO | WO 99/67671 | 12/1999 | ........... G02B/26/08 |
| WO | WO 00/04718 | 1/2000 | ........... H04N/7/167 |
| WO | WO 00/07225 | 2/2000 | ........... H01L/21/00 |
| WO | WO 01/04674 A1 | 1/2001 | ........... G02B/6/12 |
| WO | WO 01/006297 A3 | 1/2001 | ........... G02B/27/10 |
| WO | WO 01/57581 A3 | 8/2001 | ........... G02B/27/48 |
| WO | WO 02/025348 A3 | 3/2002 | ........... G02B/26/02 |

| | | | | | |
|---|---|---|---|---|---|
| WO | WO 02/31575 | A2 | 4/2002 | ........... | G02B/27/00 |
| WO | WO 02/058111 | A2 | 7/2002 | | |
| WO | WO 02/065184 | A3 | 8/2002 | ........... | G02B/27/12 |
| WO | WO 02/073286 | A2 | 9/2002 | ........... | G02B/26/08 |
| WO | WO 02/084375 | A1 | 10/2002 | ........... | G02B/26/08 |
| WO | WO 02/084397 | A3 | 10/2002 | ........... | G02B/27/18 |
| WO | WO 03/001281 | A1 | 1/2003 | ............ | G02F/1/01 |
| WO | W0 03/001716 | A1 | 1/2003 | ............ | H04J/14/02 |
| WO | WO 03/012523 | A1 | 2/2003 | ........... | G02B/26/00 |
| WO | WO 03/016965 | A1 | 2/2003 | ............ | G02B/5/18 |
| WO | WO 03/023849 | A1 | 3/2003 | ........... | H01L/23/02 |
| WO | WO 03/025628 | A2 | 3/2003 | | |

OTHER PUBLICATIONS

O. Solgaard, "Integrated Semiconductor Light Modulators for Fiber–Optic and Display Applications", Ph.D. Dissertation, Stanford University Feb., 1992.

J. Neff, "Two–Dimensional Spatial Light Modulators: A Tutorial", Proceedings of the IEEE, vol. 78, No. 5 (May 1990), pp. 826–855.

R. Gerhard–Multhaupt, "Viscoelastic Spatial Light Modulators and Schlieren–Optical Systems for HDTV Projection Displays" SPIE vol. 1255 Large Screen Projection Displays 11 (1990), pp. 69–78.

R. Gerhard–Multhaupt, "Light–Valve Technologies for High–Definition Television Projection Displays", Displays vol. 12, No. 3/4 (1991), pp. 115–128.

O. Solgaard, F. Sandejas, and D. Bloom, "Deformable Grating Optical Modulator," Optics Letters, vol. 17, No. 9, May 1, 1992, New York, USA, pp. 688–690.

F. Sandejas, R. Apte, W. Banyai, and D. Bloom, "Surface Microfabrication of Deformable Grating Valve for High Resolution Displays," The $7^{th}$ International Conference on Solid–State Sensors and Actuators.

P. Alvelda, "High–Efficiency Color Microdisplays," SID 95 Digest, pp. 307–311, 1995.

Worboys et al., "Miniature Display Technology for Integrated Helmut Systems," GEC Journal of Research, vol. 10, No. 2, pp. 111–118, Chelmsford, Essex, GB 1993.

M. Farn et al., "Color Separation by use of Binary Optics," Optics Letters, vol. 18:15 pp. 1214–1216, 1993.

P. Alvelda, "VLSI Microdisplays and Optoelectric Technology," MIT, pp. 1–93, 1995.

P. Alvelda, "VLSI Microdisplay Technology," Oct. 14, 1994.

D. Rowe, "Laser Beam Scanning," SPIE, vol. 2088, Oct. 5, 1993, 18–26.

L. Hornbeck, "Deformable–Mirror Spatial Light Modulators," Spatial Light Modulators and Applications III, Aug. 8, CA 1989, pp. 86–102.

Russick et al., "Supercritical Carbon Dioxide Extraction of Solvent from Micromachined Structures," Supercritical Fluids, Chapter 18, American Chemical Society, pp 255–269, 1997.

Buhler et al., "Linear Array of Complementary Metal Oxide Semiconductor Double–Pass Metal Micromirrors," Optical Engineering, vol. 36, No. 5, pp 1391–1398, May 1997.

Gani et al., "Variable Gratings for Optical Switching: Rigorous Electromagnetic Simulation and Design," Optical Engineering, vol. 38, No. 3, pp 552–557, Mar. 1999.

R. Tepe, et al. "Viscoelastic Spatial Light Modulator with Active Matrix Addressing," Applied Optics, vol. 28, No. 22, New York, USA, pp. 4826–4834, Nov. 15, 1989.

W. Brinker, et al., "Deformation Behavior of Thin Viscoelastic Layers Used in an Active–Matrix–Addressed Spatial Light Modulator," SPIE vol. 1018, pp. 79–85, Germany, 1988.

T. Utsunomiya and H. Sato, "Electrically Deformable Echellette Grating and its Application to Tunable Laser Resonator," Electronics and Communications in Japan, vol. 63–c, No. 10, pp. 94–100, Japan, 1980.

Burns, D.M. et al., *Development of microelectromechanical variable blaze gratings*, Sensors and Actuators A, pp. 7–15, 1998.

R.N. Thomas, et al., "The Mirror–Matrix Tube: A Novel Light Valve for Projection Displays", IEEE Transactions on Electron Devices, vol. ED–22, No. 9, pp. 765–775, Sep. 1975.

J. Guldberg, et al., " An Aluminum/SiO2/Silicon–on–Sapphire Light Valve Matrix for Projection Displays," Applied Physics Letters, vol. 26, No. 7, pp. 391–393, Apr. 1975.

"Kitchen Computer", IBM Technical Disclosure Bulletin, vol. 37, No. 12, pp. 223–225, Dec. 1994.

"Image Orientation Sensing and Correction for Notepads", Research Disclosure, No. 34788, p. 217, Mar. 1993.

Beck Mason et al., "Directly Modulated Sampled Grating DBR Lasers for Long–Haul WDM Communications Systems" IEEE Photonics Technology Letters, vol. 9, No. 3, Mar. 1997.pp. 377 of 379.

N. J. Frigo et al., "A Wavelength–Division Multiplexed Passive Optical Network with Cost–Shared Components", IEEE Photonics Technology Letters, vol. 6, No. 11, Nov. 1994, pp. 1365 of 1367.

M. S. Goodman et al., "The LAMBDANET Multiwavelength Network: Architecture, Applications, and Demonstrations", IEEE Journal on Selected Areas in Communications, vol. 8, No. 6, Aug. 1990, pp. 995 of 1004.

C. A. Turkatte, "Examining the Benefits of Tunable Lasers for Provisioning Bandwidth on Demand", EuroForum—Optical Components, Feb. 2001, pp. 1 of 10.

R. Plastow, "Tunable Lasers and Future Optical Networks", Forum –Tunable Laser, Aug. 2000, pp. 58 of 62.

Elizabeth Bruce, "Tunable Lasers", Communications, IEEE Spectrum, Feb. 2002, pp. 35 of 39.

M. G. Littman et al., "Spectrally Narrow Pulsed Dye Laser without Beam Expander", Applied Optics, vol. 17, No. 14, Jul. 15, 1978, pp. 2224 of 2227.

Apte et al., "Deformable Grating Light Valves for High Resolution Displays," Solid State Actuator Workshop, Hilton Head, South Carolina, Jun. 13–16, 1994.

Sene et al., "Polysilicon micromechanical gratings for optical modulation," Sensors and Actuators, vol. A57, pp. 145–151, 1996.

Amm et al., "Invited Paper: Grating Light Valve™ Technology: Update and Novel Applications," SID Digest, vol. 29, 1998.

Development of Digital MEMS–Based Display Technology Promises Improved Resolution, Contrast, and Speed, XP–000730009, 1997, pp. 33 of 34.

"Micromachined Opto/Electro/Mechanical Systems," Electronic Systems, NASA Tech Briefs, Mar. 1997, pp. 50 & 52.

S.T. Pai, et al., "Electromigration in Metals", Received Jun. 4, 1976, p. 103–115.

Olga B. Spahn, et al., "High Optical Power Handling of Pop–Up Microelectromechanical Mirros", Sandia National Laboratories, IEEE 2000, p. 51–52.

David M. Burns, et al., "Optical Power Induced Damage to Microelectromechanical Mirros", Sensors and Actuators A 70, 1998, p. 6–14.

V.S. Aliev et al., "Development of Si(100) surface roughness at the intitial stage of etching in F2 and XeF2 gases: ellipsometric study," Surface Science 442 (1999), pp. 206–214.

Xuan–Qi Wang et al., "Gas–Phase Silicon Etching with Bromine Trifluoride," Depart. of Electrical Engineering, 136–93 California Institute of Technology, 1997 IEEE, pp. 1505–1508.

Harold F. Winters, "Etch products from the reaction of XeF2 with SiO2, Si3N4, SiC, and Si in the presence of Ion Bombardment," IBM Research Laboratory, 1983 American Vacuum Society, pp. 927–931.

F.A. Houle, "Dynamics of SiF4 desorption during etching of silicon by XeF2," J. Chem. Phys. 87 (3), Aug. 1, 1987, pp. 1866–1872.

Mehran Mehregany, "Microelectromechanical Systems," 1993 IEEE, pp. 14–22.

D. Moser et al., "A CMOS Compatible Thermally Excited Silicon Oxide Beam Resonator with Aluminium Mirror," Physical Electronics Laboratory, 1991 IEEE, pp. 547–550.

M. Parameswaran et al., "Commercial CMOS Fabricated Integrated Dynamic Thermal Scene Simulator," 1991 IEEE, pp. 29.4.1–29.4.4.

M. Parameswaran et al., "CMOS Electrothermal Microactuators," Depart. of Electrical Engineering, 1990 IEEE, pp. 128–131.

U. Streller et al., "Selectivity in dry etching of Si(100) with XeF2 and VUV light," Applied Surface Science 106,(1996), pp. 341–346.

M.J.M Vugts et al., "Si/XeF2 etching: Temperature dependence," 1996 American Vacuum Society, pp. 2766–2774.

P. Krummenacher et al., "Smart Temperature Sensor in CMOS Technology," Sensors and Actuators, A–21–A–23 (1990), pp. 636–638.

Henry Baltes, "CMOS as sensor technology," Sensors and Actuators A. 37–38, (1993), pp. 51–56.

Thomas Boltshauser et al., "Piezoresistive Membrane Hygrometers Based on IC Technology," Sensor and Materials, 5, 3, (1993), pp. 125–134.

Z. Parpia et al., "Modelling of CMOS Compatible High Voltage Device Structures," pp. 41–50.

Jon Gildemeister, "Xenon Difluoride Etching System," 1997, UC Berkeley MicroTabrication Manual Chapter 7.15, p. 2–5.

W. Riethmuller et al., "A smart accelerometer with on–chip electronics fabricated by a commercial CMOS process," Sensors and Actuators A. 31, (1992), 121–124.

W. Gopel et al., "Sensors– A Comprehensive Survey," vol. 7, Weinheim New York, 44 pgs.

D. E. Ibbotson et al., "Comparison of XeF2 and F–atom reations with Si and SiO2," 1984 American Institute of Physics, pp. 1129–1131.

D. E. Ibbotson et al., "Plasmaless dry etching of silicon with fluorine–containing compounds," 1984 American Institute of Physics, pp. 2939–2942.

M.H. Hecht et al., "A novel x–ray photoelectron spectroscopy study of the Al/SiO2 interfaces," 1985 American Institute of Physics, pp. 5256–52616.

Daniel L. Flamm et al., "XeF2 and F–Atom Reactions with Si: Their Significance for Plasma Etching,," Solid State Technology, V. 26, #4, 4/83, pp. 117–121.

H.F. Winters et al., "The etching of silicon with XeF2 vapor," Appl. Phys. Lett. vol. 34, No. 1, Jan. 1979, pp. 70–73.

Wayne Bailey et al., "Microelectronic Structures and Microelectromechanical Devices for Optical Processing and Multimedia Applications," SPIE—The International Society for Optical Engineering, vol. 2641, Oct. 1995, 13 pgs.

J. Marshall et al., "Realizing Suspended Structures on Chips Fabricated by CMOS Foundry Processes Through the MOSIS Service," National Inst. of Standards and Technology, Jun. 94, 63 pgs.

David Moser et al., "CMOS Flow Sensors," 1993 Physical Electronics Lab, Swiss Federal Institute of Tech, Zurich, Switzerland, 195 pgs.

E. Hecht, "Optics", Addison–Wesley, $2^{nd}$ edition, 1987, Adelphi University, pp. 163–169.

E. Hecht, "Optics", Addison–Wesley, $2^{nd}$ edition, 1987, Adelphi University, pp. 358–360.

T. Glaser et al., "Beam switching with binary single–order diffractive grating", XP–000802142, Optics Letters, Dec. 15, 1998, vol. 23, No. 24, pp. 1933 of 1935.

P. C. Kundu et al., "Reduction of Speckle Noise by Varying the Polarisation of Illuminating Beam", XP–002183475, Dept. of Applied Physics, Calcutta University, 1975, pp. 63–67.

J. W. Goodman, "Some Fundamental Properties of Speckle", XP–002181682, Dept. of Electrical Engineering, Stanford University, 1976, pp. 1146–1150.

Lingli Wang et al., "Speckle Reduction in Laser Projection Systems by Diffractive Optical Elements", XP–000754330, Applied Optics, Apr. 1, 1998, vol. 37, No. 10, pp. 1770–1775.

R.W. Corrigan et al., "Calibration of a Scanned Linear Grating Light–Valve, Projection System for E–Cinema Applications", Silicon Light Machines, SID'99, San Jose, CA, 27 pgs, 1999.

R.W. Corrigan et al., "Calibration of a Scanned Linear Grating Light–Valve, Projection System", Silicon Light Machines, San Jose, CA, 4 pgs, May 18, 1999.

"Introduction to Cryptography", http://www.ssh.fi/tech/crpto/into.html, 35 pgs, Jun. 21, 1999.

"Deep Sky Black," Equinox Interscience, www.eisci.com/deepsky.html, 1997.

"Absorptive Neutral Density Filters," Newport Corp., Irvine, CA, www.newport.com, May 7, 1999.

"High Energy Variable Attenuators," Newport Corp., Irvine, CA, www.newport.com, May 7, 1999.

"Neutral–Density Filters," New Focus, Inc., Santa Clara, CA, www.newfocus.com, May 7, 1999.

J. Hawkes et al., "Laser Theory and Practice," Prentice Hall, New York, 1995, pp. 407–408.

C. Tew et al., "Electronic Control of a Digital Micromirror Device for Projection Displays", Proceedings of the 1994 IEEE International Solid–State Circuits Conference, 1994.

Henck, S.A., "Lubrication of Digital Mircomirror Devices198 ", Tribology Letters, No. 3, pp. 239–247, 1997.

K. W. Goossen et al., "Silicon Modulator Based on Mechanically–Active Anti–Reflection Layer with 1 Mbit/sec Capability for Fiber–in–the–Loop Applications", IEEE Protonics Technology Letters, vol. 6, No. 9, Sep. 1994, pp. 1119–1121.

J. A. Walker et al., "Demonstration of a Gain Flattened Optical Amplifier with Micromechanical Equalizer Element", Lucent Technologies, pp. 13–14.

A. P. Payne et al., "Resonance Measurements of Stresses in Al/Si$_3$N$_4$ Micro–Ribbons", Silicon Light Machines, Sep. 22, 1999, 11 pgs.

M. W. Miles, "A New Reflective FPD Technology Using Interferometric Modulation", 4 pgs.

N. A. Riza et al., "Digitally Controlled Fault–Tolerant Multiwavelength Programmable Fiber–Optic Attenuator Using a Two–Dimensional Digital Micromirror Device", Optics Letters, Mar. 1, 1999, vol. 24, No. 5, pp. 282–284.

N. A. Riza et al., "Synchronous Amplitude and Time Control for an Optimum Dynamic Range Variable Photonic Delay Line", Applied Optics, Apr. 10, 1999, vol. 38, No. 11, pp. 2309–2318.

P. Alvelda et al., "44.4: Ferroelectric Microdisplays Using Distortion–Compensated Pixel Layouts", SID 95 Digest, XP 2020715, pp. 931–933.

* cited by examiner

METHOD OF SEALING A HERMETIC LID TO A SEMICONDUCTOR DIE AT AN ANGLE

RELATED APPLICATION(S)

This Patent Application is a continuation-in-part of the U.S. patent application Ser. No. 09/605,198, filed Jun. 27, 2000, now abandoned and entitled "METHOD AND APPARATUS FOR SEALING AN HERMETIC LID TO A SEMICONDUCTOR" and the U.S. patent application Ser. No. 09/866,266, filed May 24, 2001, now U.S. Pat. No. 6,764,875 also entitled "METHOD AND APPARATUS FOR SEALING AN HERMETIC LID TO A SEMICONDUCTOR". The co-pending U.S. patent application Ser. No. 09/605,198 and the co-pending U.S. patent application Ser. No. 09/866,266 are both Divisional Patent Applications of the U.S. patent application Ser. No. 09/124,710, filed Jul. 29, 1998, now U.S. Pat. No. 6,303,986. The U.S. patent application Ser. No. 09/605,198, the U.S. patent application Ser. No. 09/866,266, and the U.S. patent application Ser. No. 09/124,710 are hereby incorporated by reference.

FIELD OF THE INVENTION

This invention relates to the field of encapsulation, especially hermetically. More particularly, this invention relates to the encapsulation of MEM devices with a lid structure.

BACKGROUND OF THE INVENTION

In the manufacture of integrated circuits (chips) it is well known that it is desirable to encapsulate the chip in order to protected the chip from mechanical damage and contamination. Encapsulation techniques are also known to passivate the chips an enhance their long term performance. There are a variety of well known techniques available for encapsulating chips. These techniques include mounting chips within a cavity of a substrate or a die structure, wire bonding chips to a lead frame and then enclosing the package with a lid. Another technique includes mounting chips to a lead frame, wire bonding the chips to the lead frame and then passivating the chips and a portion of the lead frame in a molded plastic or plastic epoxy body. Yet another technique for packaging and passivating chips includes "flip-chip" bonding to a printed circuit board and then covering the chips with a plastic resin.

There are several applications where the above mentioned packaging and passivation techniques are inadequate because the materials used to form the packaging are opaque and/or do not provide an optical window of suitable quality for optical applications. For example, such packaging is unsuitable for EPROM devices. An EPROM device is a read-only memory device. The program or data which is stored in an EPROM can only be erased through optical radiation (ultraviolet and/or visible) impinging on the surface of the EPROM. Conventional opaque chip packaging does not allow for such a device to be erased optically and, therefore, is unsuitable for packaging these devices. To solve this problem, makers of EPROM devices mount EPROM chips within the cavity of a ceramic package and hermetically seal the assembly with an optically transparently lid.

Micro-electro-mechanical devices (MEM devices) are another class of silicon semiconductors devices. MEM devices are useful for a variety of applications including strain gauges, accelerometers, electronic levels, and also for display light valves or other optical applications. Because of their extremely small moving parts, MEM devices are particularly susceptible to ambient conditions. Accordingly, MEM devices are traditionally sealed within the cavity of a hermetic package to control the operating environment to which the MEM is subjected.

When the MEM device is an optical MEM device, as for example in the case of display applications, the MEM device is required to be accessed optically through the packaging, wherein optical energy penetrates the package, impinges on a surface of the MEM device, and where the optical energy is reflected and/or modulated and then escapes from the package forming the optical image or signal. Though conventional ceramic packages can be hermetic, they also tend to be opaque and are, therefore, unsuitable for use with a variety of optical MEM devices.

A package which includes an optically transparent window can represent a considerable portion of the manufacturing cost for making an optical MEM device. Under certain circumstances it is important to provide a package which has an optical window of suitable optical quality which has a controlled physical relationship relative to another portion of the MEM device, such as a mechanically active portion of the MEM device or the substrate of the MEM device. Specifically, in some applications it is important to position a transparent lid at an angle relative to an optical element or elements of the MEM device to reduce surface reflections from the optically transparent window, where reflections can interfere with the intended image and/or signal.

Conventional silicon semiconductor chip packaging technology does not provide for the ability to control the physical relationship of a transparent window/lid with respect to other portions of a MEM device. Therefore, there is a need for a MEM device with an optical widow that can be controllably positioned at an angle relative to other portions of the MEM device, and in particular at an angle relative the reflective surface(s) of one or more encapsulated optical elements of the MEM device, and a method for making the same.

SUMMARY OF THE INVENTION

Many developments in the miniaturization of various optical MEM devices, often rely on suspended cantilever and/or ribbon structures to be used an optical elements. One type of an optical MEM is a grating light valve used to modulate one or more wavelengths of light. Grating light valves have applications in display, print, optical and electrical device technologies. Examples of grating light valves and their uses are disclosed in the U.S. Pat. No. 5,311,360, issued to Bloom et al., which is hereby incorporated by reference. More advanced designs and techniques for making grating light valves are described in the U.S. Pat. No. 5,841,579 and the U.S. Pat. No. 5,808,797, both issued to Bloom et al., the contents of which are also both hereby incorporated by reference.

Typically, suspended micro-structures used in grating light valves and other optical MEM devices are extremely thin, on the order of hundreds or thousands of Angstroms, and require hermetic packaging with a suitably transparent optical window through which light can enter and escape. The hermetic and transparent lids have at least two interfaces which can result in several and multiple reflections of light and interfere or diminish the output signal of the MEM device.

The current invention is directed to MEM devices and systems with transparent lids positioned at an angle in order to reduce optical interference which can be caused from reflections of light with the lids. In accordance with the method of this invention, a lid is attached to a substrate through an asymmetric seal. Preferably, the lid is positioned at an angle relative to one or more movable optical elements encapsulated between the lid and a substrate.

In accordance with a preferred method of the invention, a hermetic seal is formed through a first sealing ring formed on a sealing region of the lid and a second complimentary sealing ring formed on a sealing region of the substrate. The sealing rings provide compatible and complimentary wetting face surfaces which are preferentially wetted by a suitable soldering material placed therebetween. In accordance with an embodiment of the invention, one of the first and second sealing rings extends along a portion of an edge or side of the lid, a portion of an edges or side of the substrate, or an edge or side of both the lid and the substrate, thereby providing one or more edges or side wetting surfaces and a larger wetting surface area. A suitable solder material is then placed between the sealing rings and caused to flow. Flowing solder wets the face surfaces and edge or side wetting surface(s) of the sealing rings. Regions where the sealing rings have edge or side wetting surface(s), thereby producing an asymmetric surface tension and causing the lid to tilt.

In another embodiment of the invention, a portion of the first sealing ring is formed with channels and an overlapping portion of the second complimentary sealing ring is also formed with channels. A suitable solder material is placed between the first and second sealing ring and caused to flow, as described above. The additional surface tension created by the channels causes the solder layer to be thinner in the channel regions forming an asymmetric seal causing the lid to tilt.

In accordance with the instant invention, sealing rings can be formed from any number of materials, but preferably comprise a layer of chromium metal that is deposited directly onto the sealing regions of the lid and the substrate, or die structure, to thicknesses in a range of 200 to 600 Angstroms. Preferably, the sealing rings also comprise layers of gold metal that are deposited over the chromium layers to thicknesses in a range 5000 to 15,000 Angstroms. The gold layers are particularly well suited for providing wetting surfaces which adhere to a layer of solder material. In yet further embodiments one or more of the sealing rings comprise one or more layers formed from a material including chromium, gold, nickel, palladium, platinum or titanium.

The soldering material can be any suitable solder material that will sufficiently wet the sealing rings to provide a hermetic seal between the lid and the substrate. When the wetting surfaces are gold, the solder material is preferably a Au/Sn amalgam that is deposited on one or more of the soldering rings such that the total thickness of the solder layer or layers is in a range of 30 to 100 microns.

An optical MEM device of the present invention is preferably formed from a silicon-based material including, but not limited to, silicon (doped or un doped), silicon oxide and silicon nitride. The lid can be formed of any suitable material including, but not limited to, quartz, sapphire, silicon-based material and glass. Preferably, the lid is substantially flat and sufficiently transparent to one or more wavelengths of light in a range of 300 to 3000 nanometers. In a preferred embodiment of the invention the optical MEM device comprises a grating light valve, whereby a plurality of movable ribbon structures are suspended over a substrate and are sealed between a transparent lid and the substrate through an asymmetric seal, such as described in detail below.

DETAILED DESCRIPTION OF THE PREFERRED EMBODIMENTS

The present invention is directed to providing a hermetical seal between an optical window or lid, that is preferably formed from glass or other transparent material, and a substrate or die structure, that is preferably formed from a silicon-based material. The lid and the substrate preferably encapsulate a mechanically active portion of an optical MEM device. In accordance with the invention, the lid is positioned at an angle relative to the mechanically active portion, substrate, or both through an asymmetric seal in order to reduce reflections, which can interfere the MEM device signal and/or image. While the present invention is preferably directed to providing an asymmetric seal in optical MEM devices, the present invention can also be used to control the orientation and/or position of any number of micro-structures relative to each other by forming an asymmetric solder seal or joint.

An optical MEM device of the present invention can be a diffraction grating light valve comprising a plurality of ribbon structures that are selectively moved relative to a reference surface such those described in U.S. Pat. Nos. 5,311,360, 5,841,579 and 5,808,797 referenced previously. Alternatively, the optical MEM device can be a simple cantilever device or any other of a number of optical MEM devices known in the art.

A hermetic package, in accordance with the present invention, comprises a substrate or die structure for supporting the mechanically active portion of the optical MEM device and a lid that is sealed to the substrate or die structure through an asymmetric seal. Materials which can be used for sealing a lid to a substrate or die structure are described in U.S. Pat. No. 6,303,986, to Shook entitled "METHOD OF AND APPARATUS FOR SEALING AN HERETIC LID TO A SEMI CONDUCTOR".

Figure 1A:
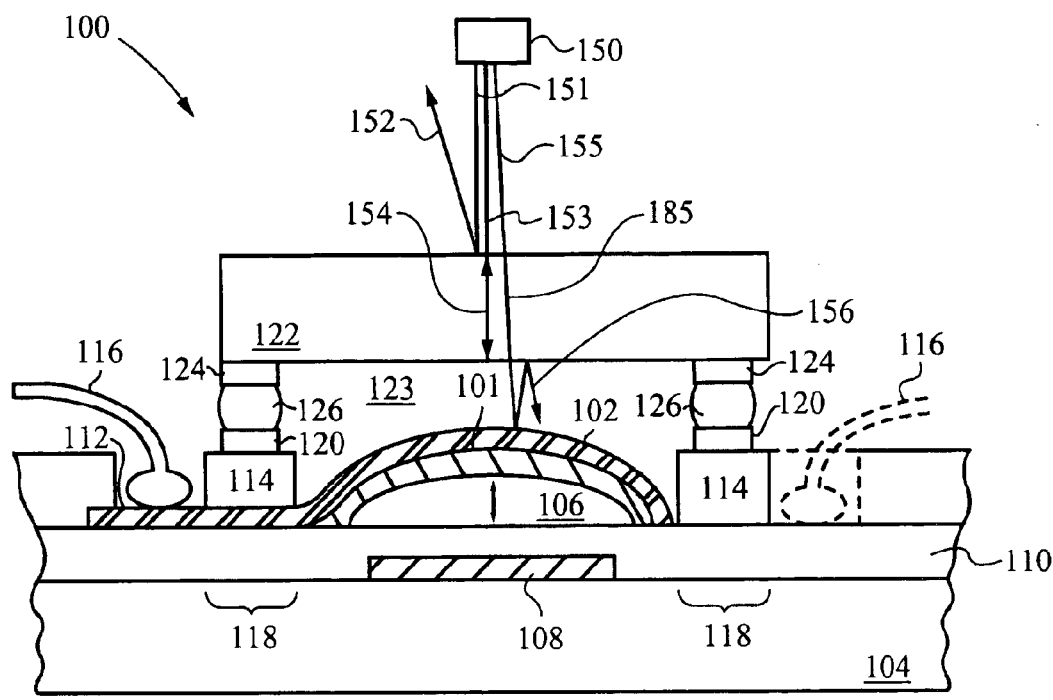
FIGS. 1a–b show a simplified cross-sectional representations of an optical MEM device with a lid sealed to a substrate and with the lid positioned substantially planar with respect to a mechanically active structure.

FIG. 1a shows a representative cross-section view of the silicon-based semiconductor device 100 with a transparent lid 122 that is hermetically sealed to a substrate 104 through a sealing region 118. The lid 122 and the substrate 104 encapsulate the mechanically active MEM structure 101 (i.e., ribbon) having a reflective layer 102 for modulating an incident light beam that is transmitted through the lid 122. The mechanically active structure 101 is formed over the substrate 104 with an air gap 106 between the mechanically active structure 101 and the substrate 104, such that the mechanically active structure 101 can move up and down relative to the substrate 104 to modulated light from a light source 150.

Still referring to FIG. 1a, a conductive electrode 108 can be formed on the surface of the substrate 104 and covered by an insulating layer 110. The conductive electrode 108 is preferably positioned underneath the ribbon 101, as shown. The reflective layer 102 can extend beyond the region of the mechanically active structure 101 and couple to a bond pad 112. The device 100 can be passivated with an insulating passivation layer 114 over a sealing region 118 to elevate the lid 122 above the mechanically active element 101. The passivation layer 114 preferably does not cover the bond pad 112, the mechanically active element 101 or the reflective layer 102. Control and power signals can be coupled to the semiconductor device 100 using conventional wire bonding structures 116.

To seal the lid 122 to the substrate 104, a first sealing ring 124 with a face surface is formed on the lid 122. A second sealing ring 120 with a complementary and overlapping face surface is formed over the passivating layer 114, or alternatively directly on the substrate 104 and a solder layer 126 is formed on one or more of the sealing rings 120 and 124. The lid 122 and substrate 104 are then aligned such that the face surfaces of the sealing rings 120 and 124 overlap with the solder layer 126 positioned therebetween. The solder layer 126 is melted and flows over the wetting face surfaces of the sealing rings 120 and 124 and hermetically seals the lid 122 and the substrate 104 together.

Because the preferred application for the present invention is for hermetically sealing an optical MEM device, the lid is preferably formed from a material with high optical quality. It will be understood by persons of ordinary skill in the art that a lid can be modified in any number of ways without departing from the scope of the invention. For example, the lid can be coated with an optically sensitive material to filter unwanted radiation, enhance reflectivity or decrease reflectivity. Additionally, the lid can function as a lens, a diffraction grating and/or have any number of optical functions.

Still referring to FIG. 1a, with the lid 122 being substantially parallel to the reflective layer 102 of the mechanically active structure (ribbon) 101, beams of the light 151, 153 and 155 from a light source 150 can be reflected off surfaces and interfaces of the lid 122 as light enters the encapsulated region 123 and escapes the encapsulated region 123 through the lid 122 or is internally reflected within the encapsulated region 123 to form the reflected beams 152, 154 and 156, respectively. These reflected beams 152, 154 and 156 can interfere with the intended signal of the MEM device 100. Accordingly, it can be useful to seal the lid 122 at an angle relative to the reflective layer 102 of the mechanically active structure 101.

Figure 1B:
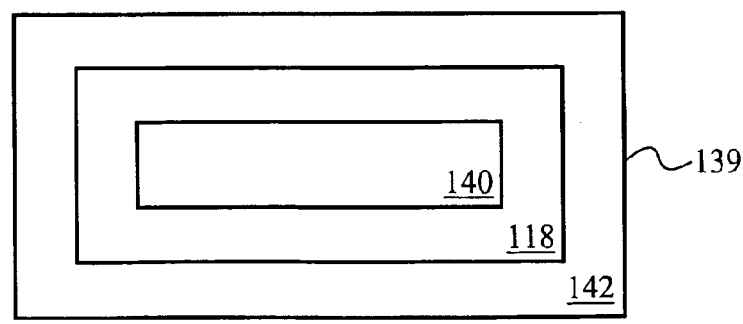

FIG. 1b shows a top schematic view of a surface 139, which can represent the surface of a lid or a substrate. In accordance with the present invention, there is a mechanically active region 140 corresponding approximately to the position of a mechanically active structure of an optical MEM device, such as described previously. Surrounding the mechanically active region 140, there is a sealing region 118. While the sealing region 118 is schematically shown as being rectangular in geometry, it is understood that the sealing region 118 can have any number of shapes including square, round, oval and any number of irregular shapes. In accordance with the invention, a sealing ring (not shown) is formed over the sealing region 118 and around the mechanically active region 140, whereby the sealing ring provides for an asymmetrically distributed wetting surface(s) used to control the flow of a suitable solder material and generate an asymmetric hermetic seal.

Where the sealing region 118 corresponds to a sealing region of a substrate, preferably there is also a bonding region 142 which surrounds the sealing region 118. The bonding region 142 includes several bond pads (not shown) necessary for making interconnections between the semiconductor device integrated circuits or off-chip circuits. The bonding region 142 can be configured to support any number of bond pads suitable for the application at hand.

Figure 2A:
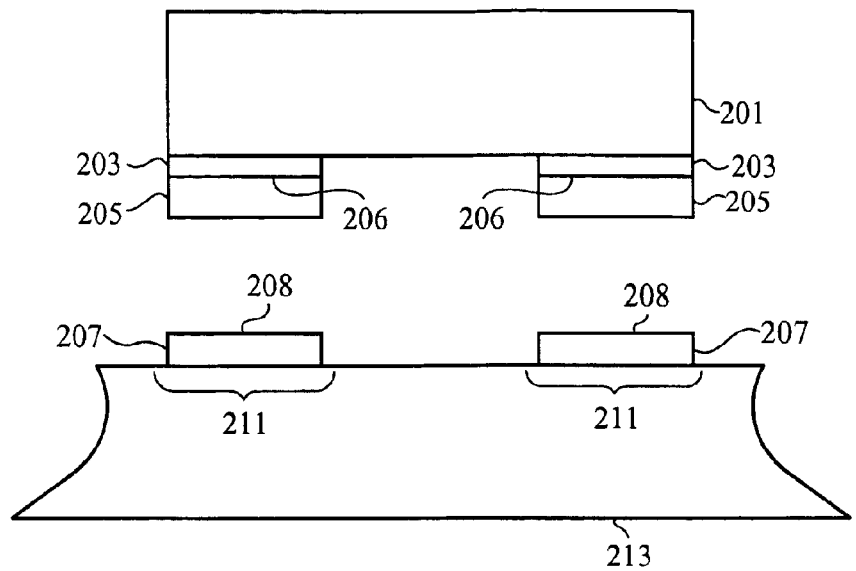
FIGS. 2a–b show a schematic cross-sectional representations of a lid and a substrate with sealing rings formed around sealing regions of the lid and the substrate and with a solder layer formed therebetween.
Figure 2B:
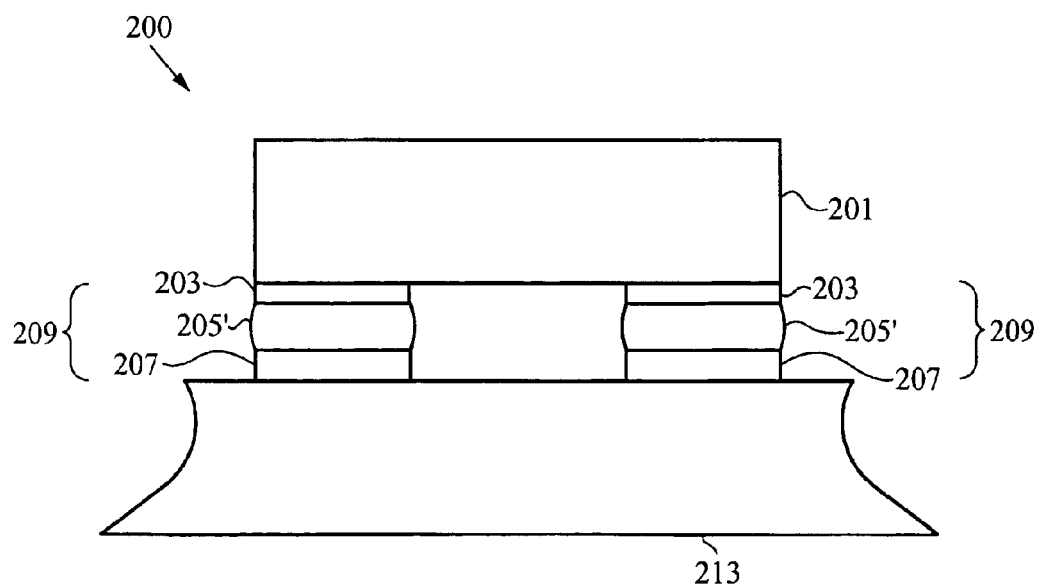

FIGS. 2a–b show schematic cross-sectional diagrams of the lid 201 and substrate 213 with sealing rings 203 and 207, respectively, and a solder layer 205 positioned therebetween for forming a hermetic seal between the lid 201 and the substrate 213.

Still referring to FIG. 2a, a first sealing ring 203 is formed on the lid 201 to provide a first face wetting surface 206. The first sealing ring 203 is preferably formed from a metal or metal alloy which provides the face wetting surface 206 capable of adhering the solder layer 205. Preferably, the first sealing ring 203 comprises a layer of chromium and a layer of gold, as described below. On the substrate 213, a second sealing ring 207 is formed with a second face wetting surface 208, whereby the wetting surfaces 206 and 208 have complementary or overlapping portions. The second sealing ring 207 is preferably formed from a metal or metal alloy which provides a face wetting surface 208 capable of adhering to the solder layer 205. Preferably, the second sealing ring 207 also comprises a layer of chromium and a layer of gold, as described below.

The solder layer 205 can be formed on one or both of the sealing rings 203 and 207. In FIG. 2a, the solder layer is shown as being formed on the first sealing ring 203 for illustrative purposes. It is understood that the solder layer 205 can, alternatively, be formed on the second sealing ring 207 or on both the first sealing ring 203 and the second sealing ring 207. The solder layer 205 is formed from any suitable solder material that is compatible with the sealing rings 203 and 207, whereby the solder material sufficiently wets the surfaces 206 and 208 when melted to thereby form a hermetic seal.

To seal the lid 201 to the substrate 213, the lid 201 and the substrate 213 are aligned and positioned to be contacted through the sealing rings 203 and 207 with the solder layer 205' therebetween, as shown in FIG. 2b. The temperature of the aligned structure 200 is adjusted to cause the solder layer 205 to become a fluid solder layer 205' which wets and adheres to the both wetting surfaces 206 and 208 and form a hermetic seal 209.

Figure 3:
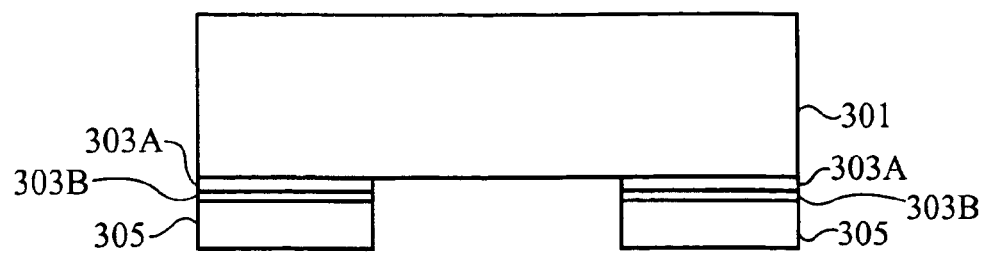
FIG. 3 shows schematic cross-sectional representation of a multi-layer sealing ring formed on a sealing region of a lid or a substrate, in accordance with an embodiment of the present invention.

In accordance with an embodiment of the invention, shown in FIG. 3, a sealing ring on a lid or substrate 301 comprises a first layer 303A formed from a first metal or a metal alloy. Preferably, the first metal is chromium, wherein the chromium layer 303A is preferably deposited over a sealing region of the lid or substrate 301 to a thickness in a range of 200 to 600 Angstroms. Over the first layer 303A, a second layer 303B is formed from a second metal or metal alloy which adheres to the first layer 303A. When the first layer 303A is chromium, then the second layer 3030B can be formed from gold that is deposited over the chromium layer to a thickness in a range 5000 to 15,000 Angstroms.

After the multi-layer sealing ring comprising layers 303A and 303B is formed, then a solder layer 305 can be deposed over the sealing ring. The solder layer 305 is formed from a material that adheres to the second layer 303B. When the second layer 303B is gold, the solder layer can be formed from an 80 Au/20 Sn amalgam that is deposited onto the second layer 303B to a thickness of approximately 50 microns.

Figure 4:
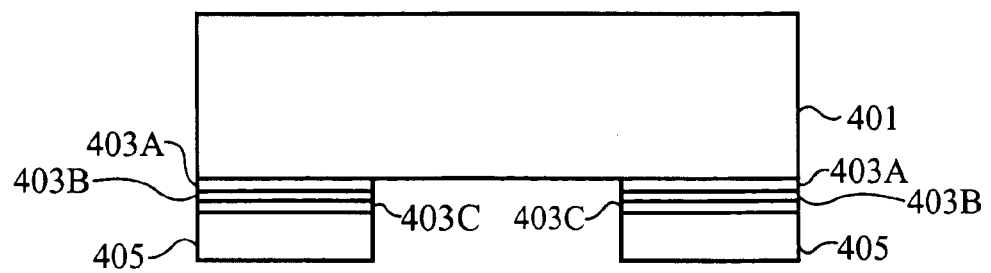
FIG. 4 shows a schematic cross-sectional representation of a multi-layer sealing ring formed on a sealing region of a lid or a substrate, in accordance with an embodiment of the present invention.

Now referring to FIG. 4, in accordance with further embodiments of the present invention, a sealing ring is formed on a sealing region of a lid or a substrate, wherein the sealing ring comprises a first metal layer 403A that is formed from titanium deposited to a thickness of approximately 300 Angstrom. On the first layer 403A, a second layer is formed from Nickel that is preferably deposited to a thickness of approximately 1000 Angstroms. On the second layer 403B, third layer 403C is formed from platinum that is deposited to a thickness of approximately 1000 Angstroms. A solder layer 405 in then formed over the third layer 403C with a 80 Au/20 Sn amalgam deposited to a thickness of approximately 50 microns.

Figure 5A:
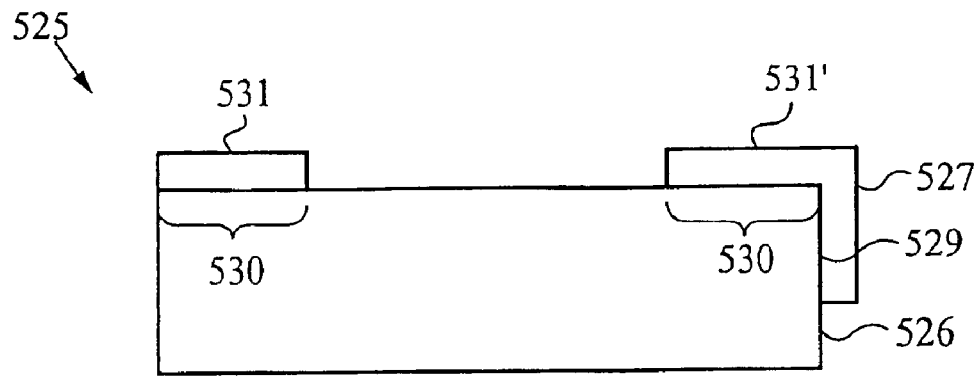
FIGS. 5a–c show schematic cross-sectional representations of sealing ring with asymmetric wetting surface areas for forming an asymmetric seals, in accordance with an embodiment of the present invention.
Figure 5B:
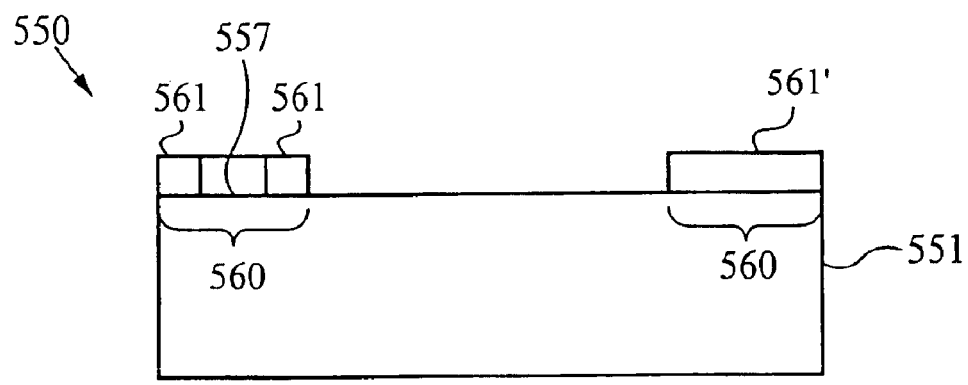
Figure 5C:
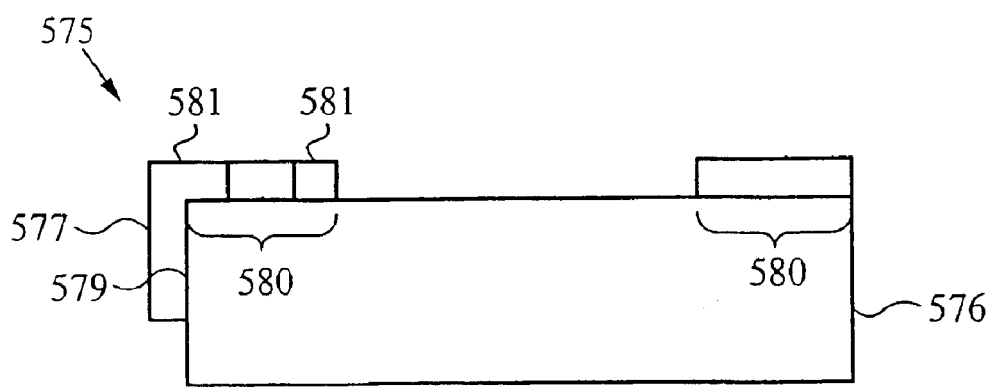

FIGS. 5a–c show schematic cross-sectional views of sealing rings configured to provide an asymmetric distribution of wetting surface areas for forming an asymmetric seal between a lid and a substrate, in accordance with the instant invention. Referring to FIG. 5a, a sealing ring comprising a first side 531 and second side 531' is formed over a sealing region 530 of a lid or substrate 526. A portion of the second side 531 of the sealing ring extends along the edge or side 529 of the lid or substrate 526 to provide an edge or side wetting surface 527. In accordance with this embodiment, a second complementary sealing ring (not shown) with or without an edge or side portion, is formed on the other of the lid or substrate such that the sealing rings have overlapping face wetting surfaces.

Referring now to FIG. 5b, a portion of a sealing ring, in accordance with an alternative embodiment, is patterned to provide an asymmetric distribution of wetting surfaces. A sealing ring is formed on a sealing region 560 of a lid or substrate 551 with a portion of a first side 561 being patterned with features that are preferably channel features 557. A second side 561' of the sealing ring is substantially continuous over the sealing region 560 of the lid or substrate 551. In accordance with this embodiment, a second sealing ring (not shown) is formed on the other of the lid or substrate, such that the sealing rings have overlapping pattern surfaces. While the sealing rings are preferably patterned with channel features, other patterned surfaces which provide for an asymmetric distribution of wetting surfaces may also be used.

Now referring to FIG. 5c, in yet further embodiments of the present invention, a sealing ring is formed over a sealing region 580 of a lid or substrate 576, wherein a portion of a first side 581 of the sealing ring is patterned with one or more patterned features, such as the channel features 557 described above. Further, at least a portion of the first side 581 of the sealing ring extends along the edge or side 579 of the lid or substrate 576 to provide an edge or side wetting surface 577, such as illustrated in FIG. 5c. In accordance with this embodiment, a second sealing ring (not shown) is formed on the other of the lid or substrate with overlapping patterned surfaces and with or without an edge or side feature.

Figure 6A:
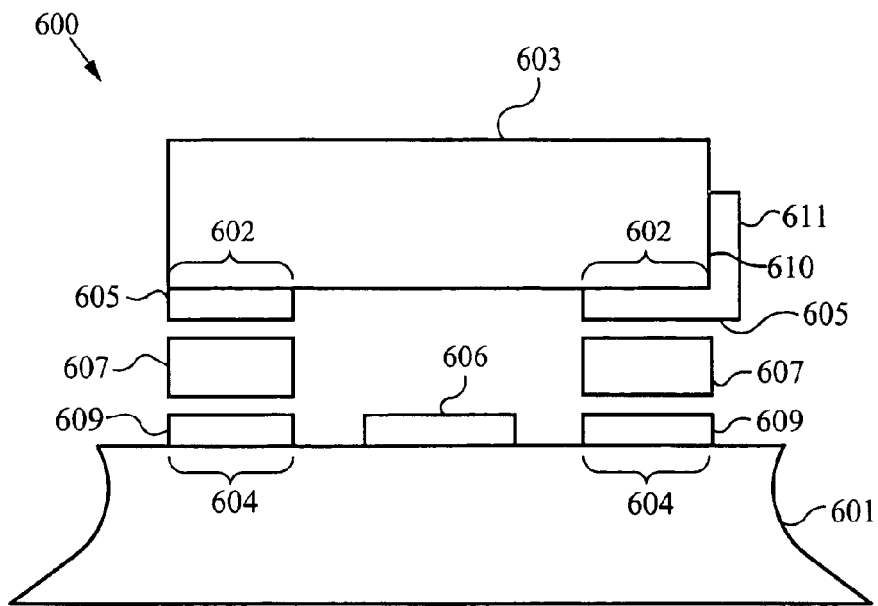
FIGS. 6a–b illustrate forming an asymmetric seal between a lid and a substrate using sealing rings with at least one edge wetting surface, in accordance with an embodiment of the present invention.

Referring to FIG. 6a, a MEM device 600, in accordance with the present invention, includes a mechanically active portion 606, that is preferably configured to modulate a light source (not shown), as described above. The device 600 also comprises at least one asymmetric sealing ring 605, shown in FIG. 6a as being formed over a first sealing region 602 of the lid 603 and a second ring 609 formed over a second sealing region 604 on a substrate 601. The asymmetric sealing ring 605 comprises a portion that extends along the edge or side 610 of the lid 603 to provides an edge wetting surface 611. A layer of compatible solder material 607 is placed between the first sealing ring 605 and the second sealing ring 609. The lid 603 and the substrate 601 are aligned such that face wetting surfaces of the first sealing ring 605 and the second sealing ring 609 overlap in the region between the sealing first sealing region 602 and the second sealing region 604.

Figure 6B:
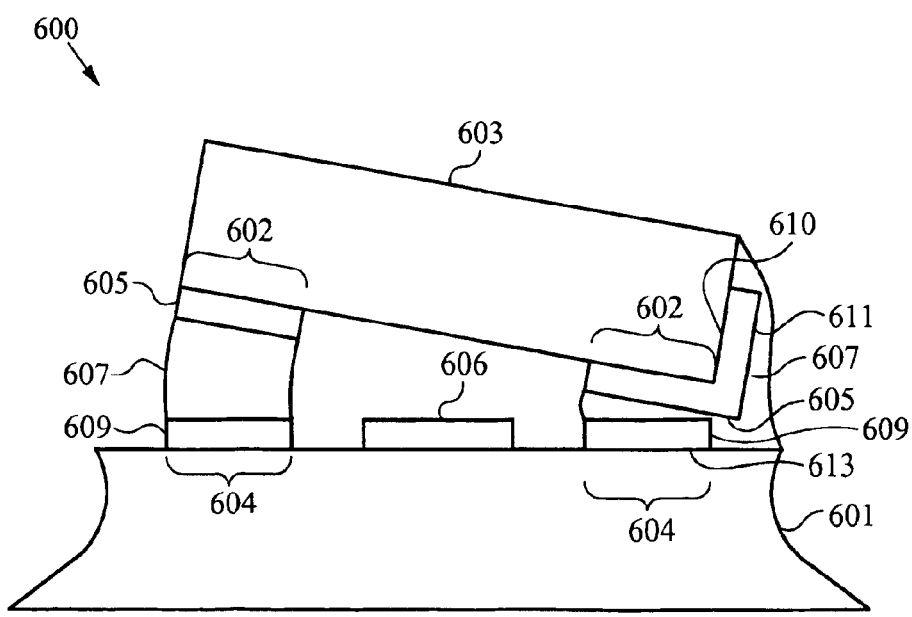

Now referring to FIG. 6b, the temperature of the structure 600 is adjusted to a temperature that is sufficient to cause the solder material 607 to become fluid and wet the face and edge or side wetting surfaces of the first sealing ring 605 and the face wetting surface 611 of the second sealing ring 609. In order to wet the edge surface 611 of the first sealing ring 605, soldering material 607 will be depleted between the sealing regions 602 and 604 on the side with the edge wetting surface 611 causing the lid 603 to tilt.

Figure 7A:
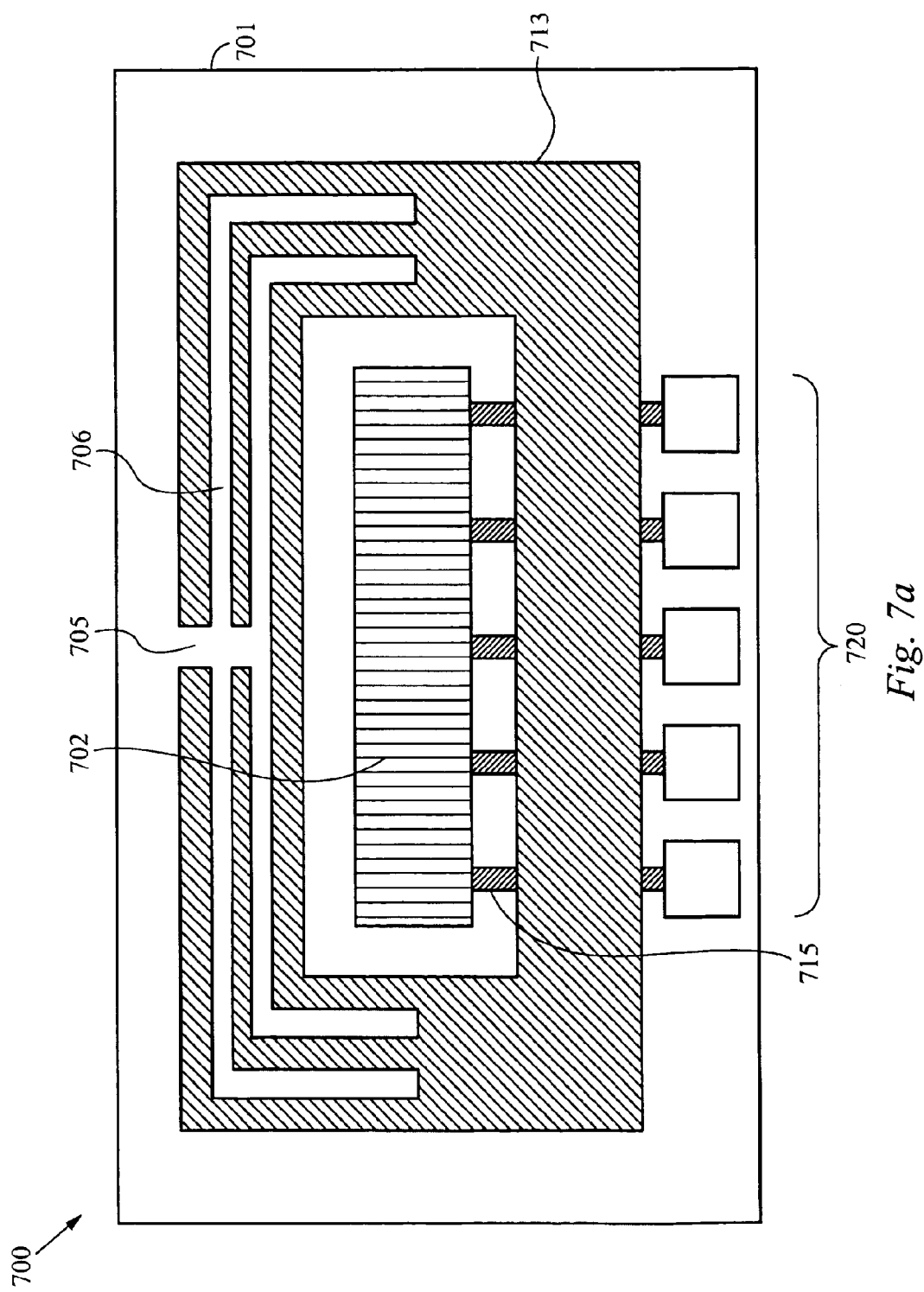
FIGS. 7a–b illustrate patterned sealing rings to provide asymmetric surface tension, in accordance with the invention.
Figure 7B:
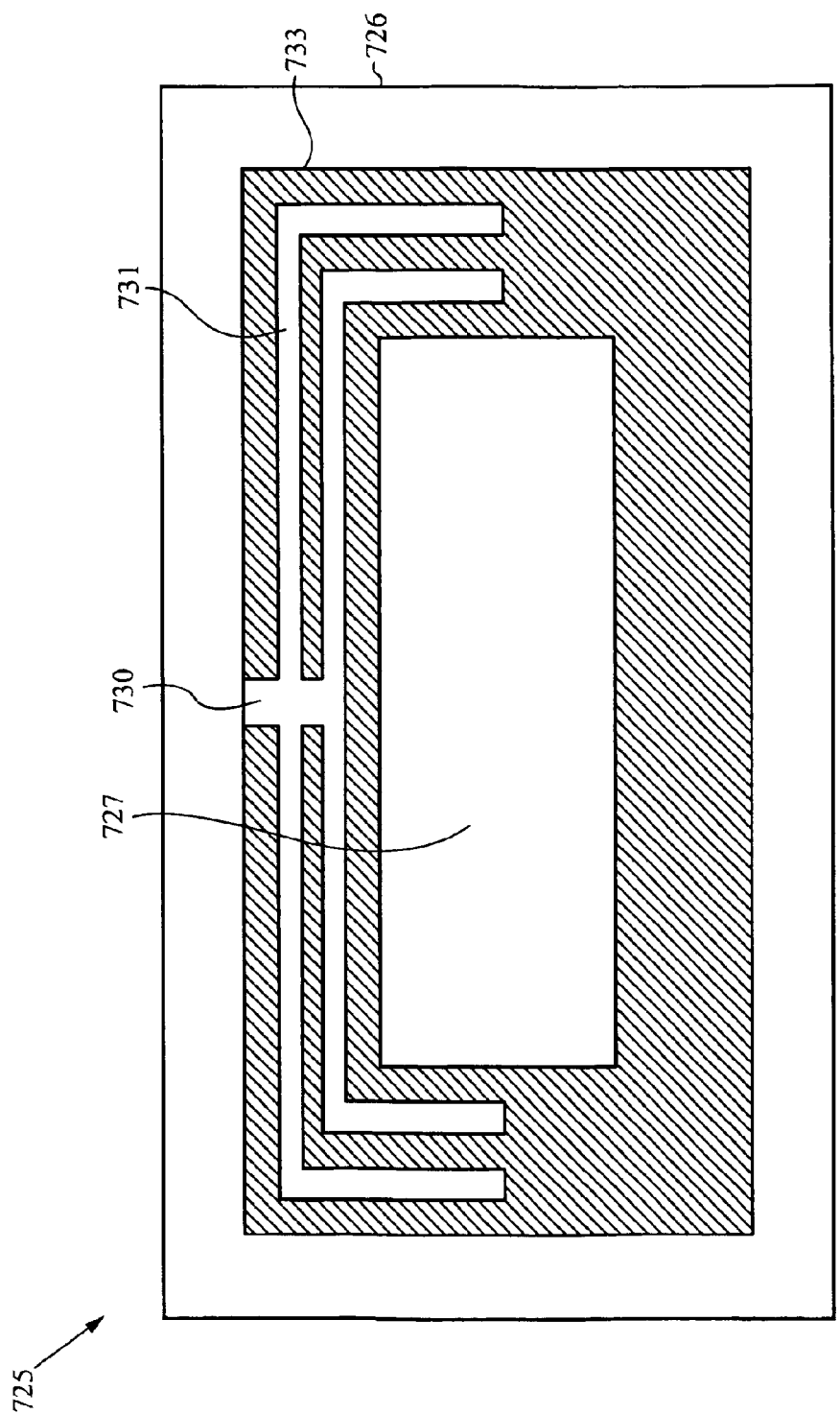

FIGS. 7a–b show top views of structures 700 and 725 with patterned sealing rings 713 and 733, in accordance with the present invention. Referring to FIG. 7a, the structure 700 comprises a substrate 701 with a patterned sealing ring 713 formed thereon. The sealing ring 713 is preferably formed from one or more metal layers, such as described above. The sealing ring 713 comprises a substantially continuous region and a patterned region. The patterned region is preferably patterned with channels 706 and one or more gaps 705 which provide for an asymmetric distribution of wetting surfaces. A device 702, such as an optical MEM device, is coupled to the substrate 701 and is encircled by the patterned sealing ring 713. Preferably, the structure 700 has a set of bond pads 720 for providing electrical connections to the device 702 after the device 702 is sealed, as described below.

Referring now to FIG. 7b the structure 700 comprises a transparent lid 726 with the complementary patterned sealing ring 733 formed thereon. The sealing ring 733 is preferably formed from one or more metal layers, such as described above. The sealing ring 733 comprises a substantially continuous region and a patterned region and is configured to substantially overlay with the patterned sealing ring 713. The patterned region is preferably patterned with channels 731 and one or more gaps 730 which provide for an asymmetric distribution of wetting surfaces. The structure 725 has a window section 727 that is encircled by the patterned sealing ring 733 and when sealed to the structure 700, provides an optical path for the transmission of light to and from the device 702.

Figure 8A:
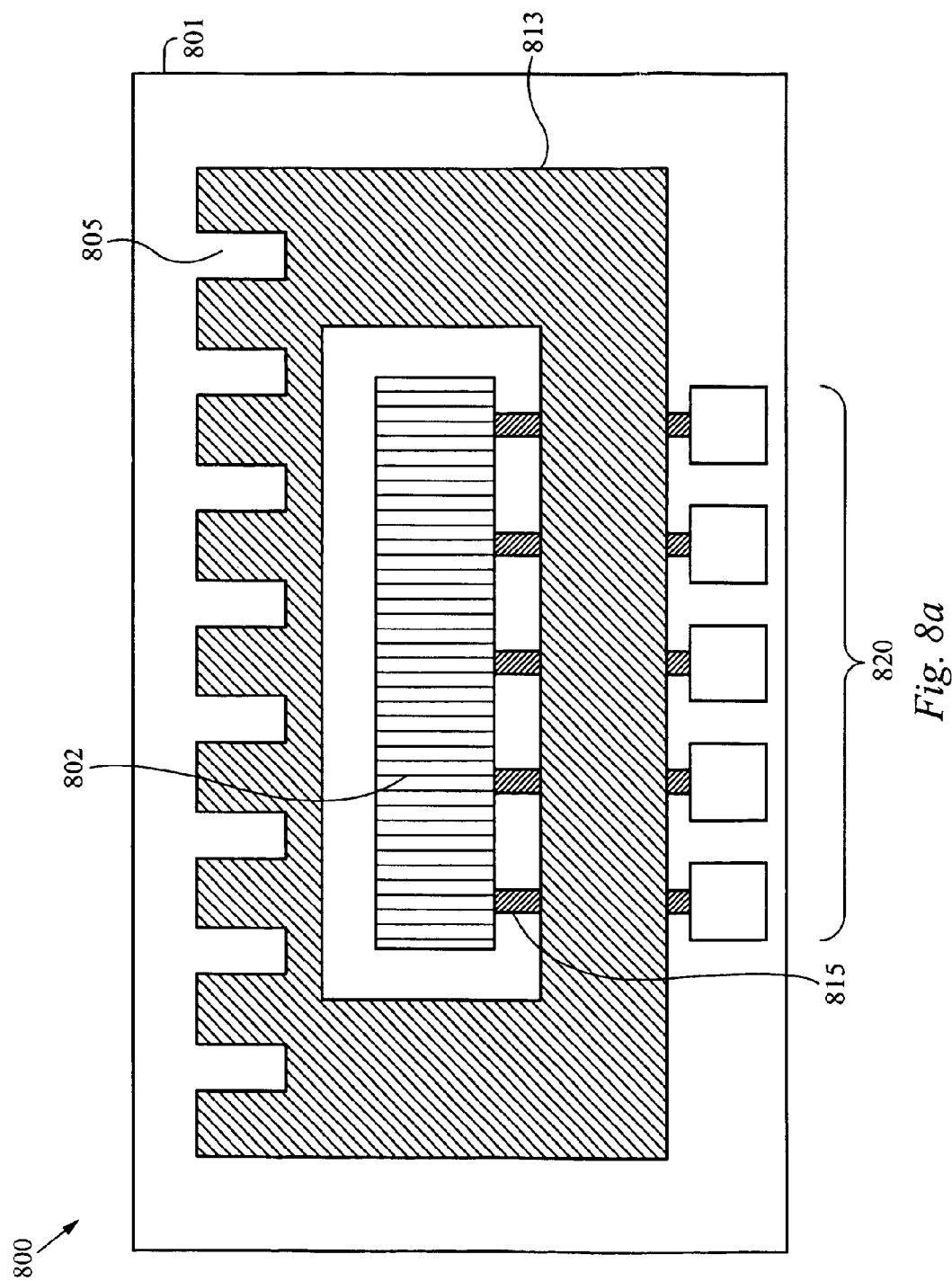
FIGS. 8a–b illustrate patterned sealing rings to provide asymmetric surface tension, in accordance with alternative embodiments of the invention.
Figure 8B:
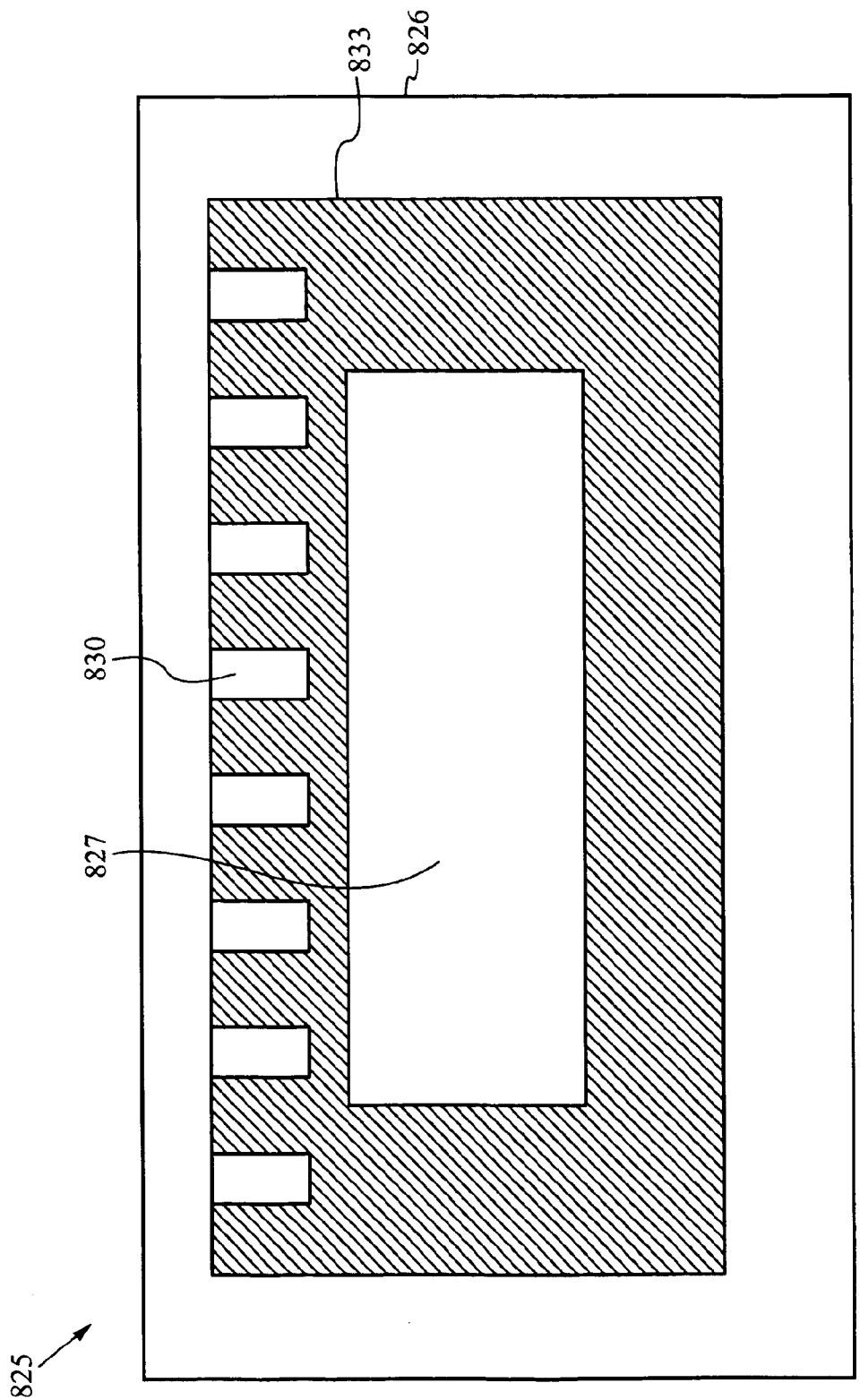

FIGS. 8a–b show top views of structures 800 and 825 with patterned sealing rings 813 and 833, in accordance alternative embodiments of the invention. Referring to FIG. 8a, the structure 800 comprises a substrate 801 with a patterned sealing ring 813 formed thereon. The sealing ring 813 is preferably formed from one or more metal layers, such as described above. The sealing ring 813 comprises a substantially continuous region and a patterned region. The patterned region is preferably patterned with an array of gaps 805 which provide for an asymmetric distribution of wetting surfaces. A device 802 is coupled to the substrate 801 and is encircled by the patterned sealing ring 813. Preferably, the structure 800 has a set of bond pads 820 for providing electrical connections to the device 802 after the device 802 is sealed, as described below.

Referring now to FIG. 8b the structure 825 comprises a transparent lid 826 with the complementary patterned sealing ring 833 formed thereon. The sealing ring 833 is preferably formed from one or more metal layers, such as described above. The sealing ring 833 comprises a substantially continuous region and a patterned region and is configured to substantially overlay with the patterned sealing ring 813. The patterned region is preferably patterned an array of gaps 830 which provide for an asymmetric distribution of wetting surfaces. The structure has a window section 827 that is encircled by the patterned sealing ring 833 and when sealed to the structure 800 and provides an optical path for the transmission of light to and from the device 802.

Figure 9:
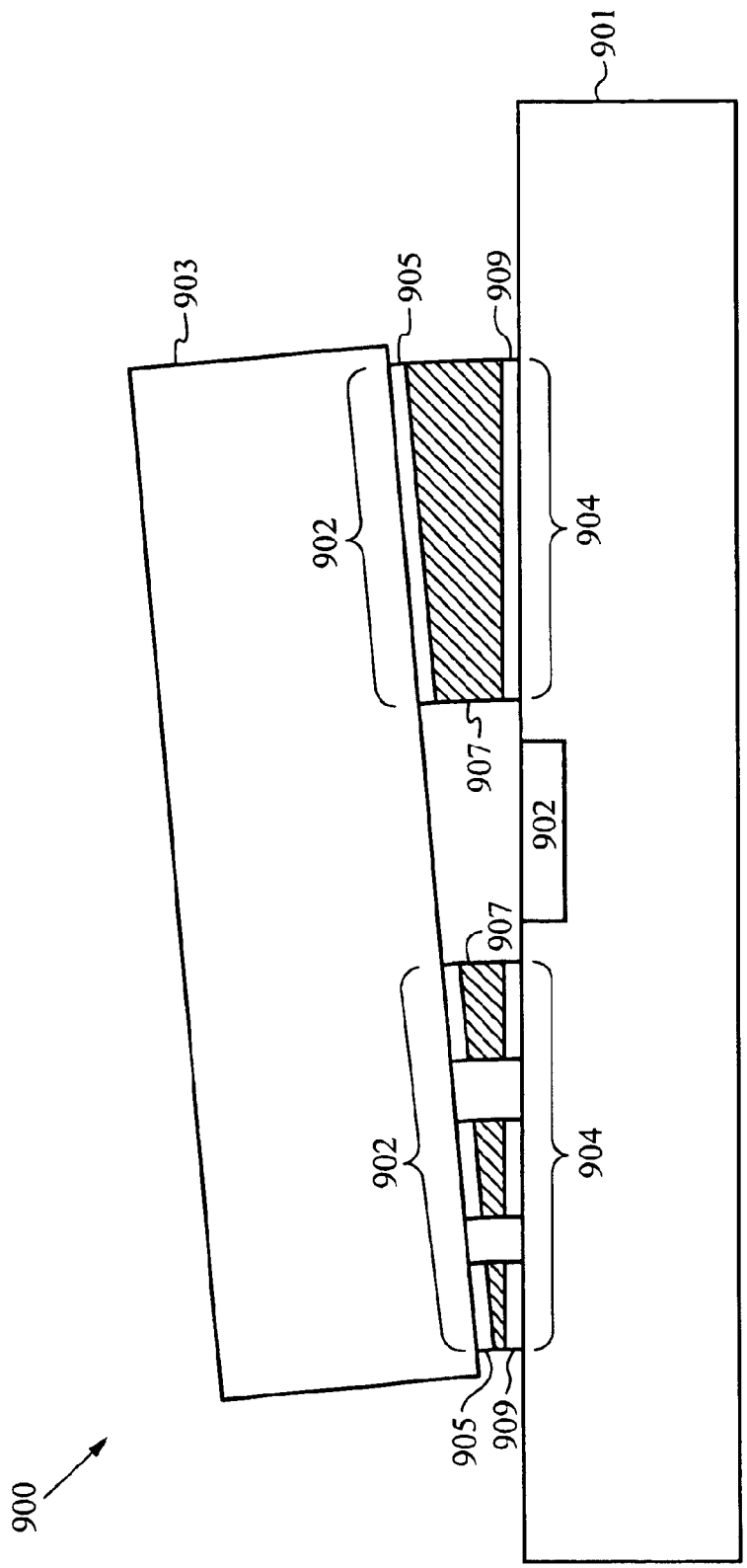
FIG. 9 illustrates forming an asymmetric seal between a lid and a substrate using a set of complementary patterned sealing rings, in accordance with the invention.

Referring to FIG. 9, a MEM device 900 includes a mechanically active portion 902, that is preferably configured to modulate a light source, as described above. The device 900 also comprises a first asymmetric sealing ring 905 formed over the sealing region 902 of a lid 903 and a second asymmetric sealing ring 909 formed over a complementary sealing region 904 of a substrate 901. The first sealing ring 905 and the second sealing ring 909 have overlapping portions which are patterned, preferably with channel features and/or gap features, such as those illustrated in FIGS. 7a–b and FIGS. 8a–b.

To seal the substrate 901 and the lid 903 together, a layer of compatible solder material 907 is placed between the first sealing ring 905 and the second sealing ring 909. The lid 903 and the substrate 901 are aligned such that face wetting surface of the first sealing ring 905 and the second sealing ring 909 overlapping in the regions between the first sealing region 902 and the second sealing region 904 and with the patterned portions overlapping.

Still referring to FIG. 9, the temperature of the structure 900 is adjusted to a temperature that is sufficient to cause the solder material 907 to flow and wet the face surfaces of the first sealing ring 905 and the second sealing ring 909. In order to wet the patterned portions of the first sealing ring 905 and the second sealing ring 909, the soldering material 907 will be depleted between the sealing region 902 and 904 corresponding to the overlapping patterned portions of the sealing rings 905 and 909, causing the lid 903 to tilt, as shown.

Figure 10A:
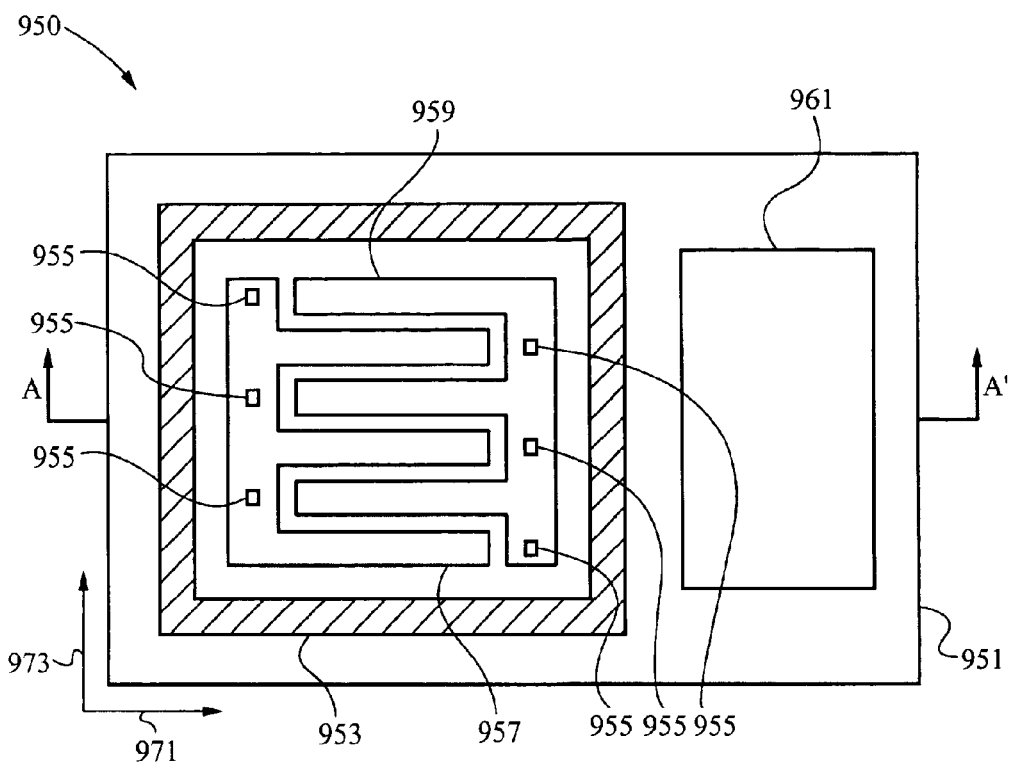
FIGS. 10a–c show a simplified top view and cross-sectional views of an optical MEM device formed on an IC wafer and sealed with lid through an asymmetric seal, in accordance with an embodiment of the present invention.

FIG. 10a shows a top view of a micro-device 950 in the plane of the arrows 971 and 973. The micro-device 950 comprises a chip 951 with one or more comb structures 957 and 959. Each of the comb structures 957 and 959 has a plurality of movable ribbon micro-structures. The one or more of the comb structures 957 and 959 are preferably electrically coupled to a circuit 961, also on the chip 951 and configured for selectively moving the ribbons of one or more of the comb structures 957 and 959. Preferably, the comb structures 957 and 959 are coupled to and/or secured to the chip 951 through securing features 955. The micro-device 950 also preferably has a sealing region around the comb structures 957 and 959 for sealing an optical lid, as described above.

Figure 10B:
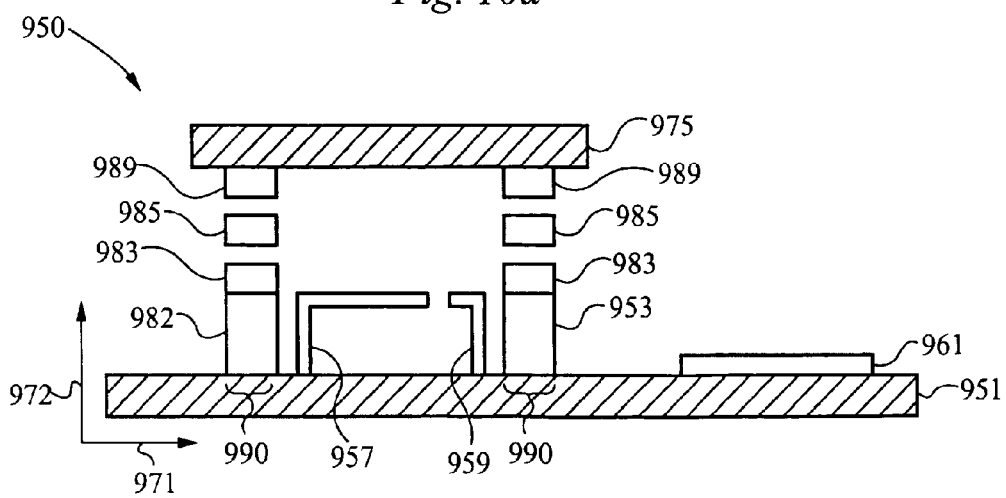
Figure 10C:
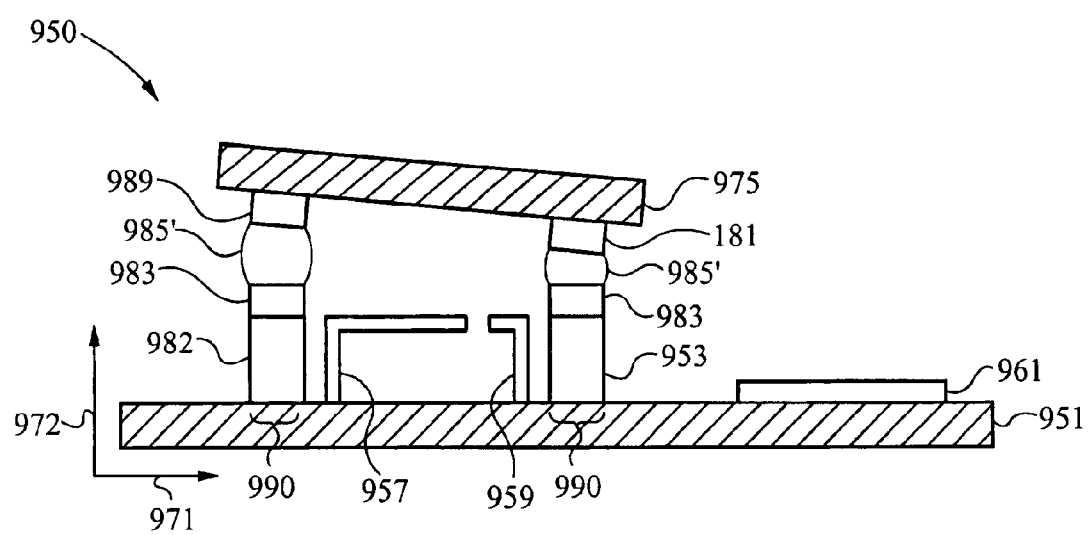

FIG. 10b illustrates a schematic side cross-sectional view of the micro-device 950 shown in FIG. 9a, in the plane of the arrows 971 and 972, which is orthogonal with the plane 971 and 973 through the line A—A' of the FIG. 9a. From the side view shown in FIG. 9b, it can be seen that the comb structures 957 and 959 are suspended above the surface of the chip 951. The sealing region 990 can comprise a passivating layer 982, as shown, to hold lid 975 above the suspended comb structure 957 and 959. The lid 975 is preferably formed from glass, silicon, or other material or combination of materials suitable for the application at hand, viz. transparent to one or more wavelength of light to be modulated.

In order to seal the lid 975 over the sealing region 990 of the chip 951, a first sealing ring 989 is formed on the lid 975 and a second sealing ring 983 is formed over the sealing region 990 of the chip 951, as previously described, wherein one or both of the sealing rings 989 and 983 provide an asymmetric distribution of wetting surface areas over the sealing region 990. Using the solder flow techniques described previously, the lid is sealed to the chip 951 though an asymmetric solder layer 985' such as shown in FIG. 9c, causing the lid to tilt.

The present invention has been described in terms of specific embodiments incorporating details to facilitate the understanding of principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A micro-machine device comprising:
   a. a lid comprising a first sealing region;
   b. a substrate comprising a second sealing region;
   c. an optical element; and
   d. a hermetic seal between the first sealing region and the second sealing region encapsulating the optical element between the lid and the substrate, the hermetic seal comprising:
      i. a first sealing ring formed on the first sealing region;
      ii. a second sealing ring formed on the second sealing region; and
      iii. an asymmetric solder layer between the first sealing ring and the second sealing ring,
   whereby at least one of the sealing rings includes an asymmetric distribution of wetting areas, and
   wherein the asymmetric solder layer is formed by flowing over the asymmetrically-distributed wetting areas, and
   wherein the asymmetric solder layer causes a tilt of the lid so that the lid is non-parallel to (i.e. tilted with respect to) the substrate.

2. The micro-machine of claim 1, wherein at least one of the first sealing ring and the second sealing ring comprises an edge.

3. The micro-machine of claim 1, wherein the at least one of the first sealing ring and the second sealing ring comprises a layer of nickel sandwiched between a layer of chromium and a layer of gold.

4. The micro-machine of claim 1, wherein at least one of the first sealing ring and the second sealing ring comprises a layer of titanium, a layer of platinum and a layer of nickel, the layer of nickel being sandwiched between the layer of titanium and the layer of platinum.

5. The micro-machine of claim 4, wherein the asymmetric layer of titanium is adjacent to at least one of the first sealing region and the second sealing region and wherein the platinum layer is adjacent to the asymmetric solder layer.

6. The micro-machine of claim 1, wherein a portion of the first sealing ring and a complementary portion of the second sealing ring are patterned.

7. The micro-machine of claim 6, wherein the portion of the first sealing ring and the complementary portion of the second sealing ring are patterned with channels.

8. The micro-machine of claim 7, wherein the channels have widths that are greater than or equal to the maximum thickness of the asymmetric solder layer.

* * * * *